United States Patent
Migita et al.

(10) Patent No.: US 8,847,643 B2
(45) Date of Patent: Sep. 30, 2014

(54) SEMICONDUCTOR DEVICE AND INFORMATION PROCESSING APPARATUS

(71) Applicant: Fujitsu Limited, Kawasaki (JP)

(72) Inventors: Koji Migita, Kawasaki (JP); Yoshito Koyama, Kawasaki (JP); Kazumasa Kubotera, Kawasaki (JP); Yasutaka Kanayama, Inagi (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 13/949,008

(22) Filed: Jul. 23, 2013

(65) Prior Publication Data

US 2013/0307597 A1 Nov. 21, 2013

Related U.S. Application Data

(63) Continuation of application No. PCT/JP2011/051463, filed on Jan. 26, 2011.

(51) Int. Cl.
*H03L 7/06* (2006.01)
*H03L 1/00* (2006.01)
*H03K 5/13* (2014.01)
*H03K 5/00* (2006.01)

(52) U.S. Cl.
CPC .. *H03L 1/00* (2013.01); *H03K 5/13* (2013.01); *H03K 2005/00078* (2013.01)
USPC .......................................... 327/156; 327/147

(58) Field of Classification Search
CPC .......... H03L 7/0891; H03L 7/095; H03L 7/18
USPC ....................................................... 327/156
See application file for complete search history.

(56) References Cited

U.S. PATENT DOCUMENTS

| | | | |
|---|---|---|---|
| 6,486,716 B1 | 11/2002 | Minami et al. | |
| 8,456,206 B2* | 6/2013 | Namdar-Mehdiabadi et al. | 327/156 |
| 2005/0008111 A1 | 1/2005 | Suzuki | |
| 2007/0090886 A1* | 4/2007 | Kriz | 331/17 |
| 2007/0090887 A1* | 4/2007 | Seefeldt et al. | 331/17 |
| 2008/0116983 A1* | 5/2008 | Kinugasa et al. | 331/25 |
| 2009/0251226 A1* | 10/2009 | Kathuria et al. | 331/1 R |
| 2009/0284318 A1* | 11/2009 | Machado | 331/16 |

(Continued)

FOREIGN PATENT DOCUMENTS

| | | |
|---|---|---|
| JP | 2001-075671 A | 3/2001 |
| JP | 2005-033392 A | 2/2005 |

OTHER PUBLICATIONS

International Search Report of PCT/JP2011/051463, mailing date of Feb. 22, 2011.

*Primary Examiner* — Adam Houston
(74) *Attorney, Agent, or Firm* — Westerman, Hattori, Daniels & Adrian, LLP

(57) ABSTRACT

A semiconductor device includes a delay part configured to assign a delay to an input signal, a phase detector configured to detect a phase of an output signal output from the delay part, a setting part configured to set a stable operations range of the phase of the output signal based on phase information output from the phase detector, and an error detector configured to set an acceptable range corresponding to the stable operations range, determine whether a phase of the output signal falls within the acceptable range, and change the acceptable range based on an extraneous factor of an input signal of the delay part.

12 Claims, 16 Drawing Sheets

(56) References Cited

U.S. PATENT DOCUMENTS

| | | | |
|---|---|---|---|
| 2011/0156780 A1* | 6/2011 | Kang et al. | 327/158 |
| 2011/0267150 A1* | 11/2011 | Fan et al. | 331/36 R |
| 2012/0206176 A1* | 8/2012 | Hwang et al. | 327/156 |
| 2014/0062554 A1* | 3/2014 | Nam et al. | 327/158 |

* cited by examiner

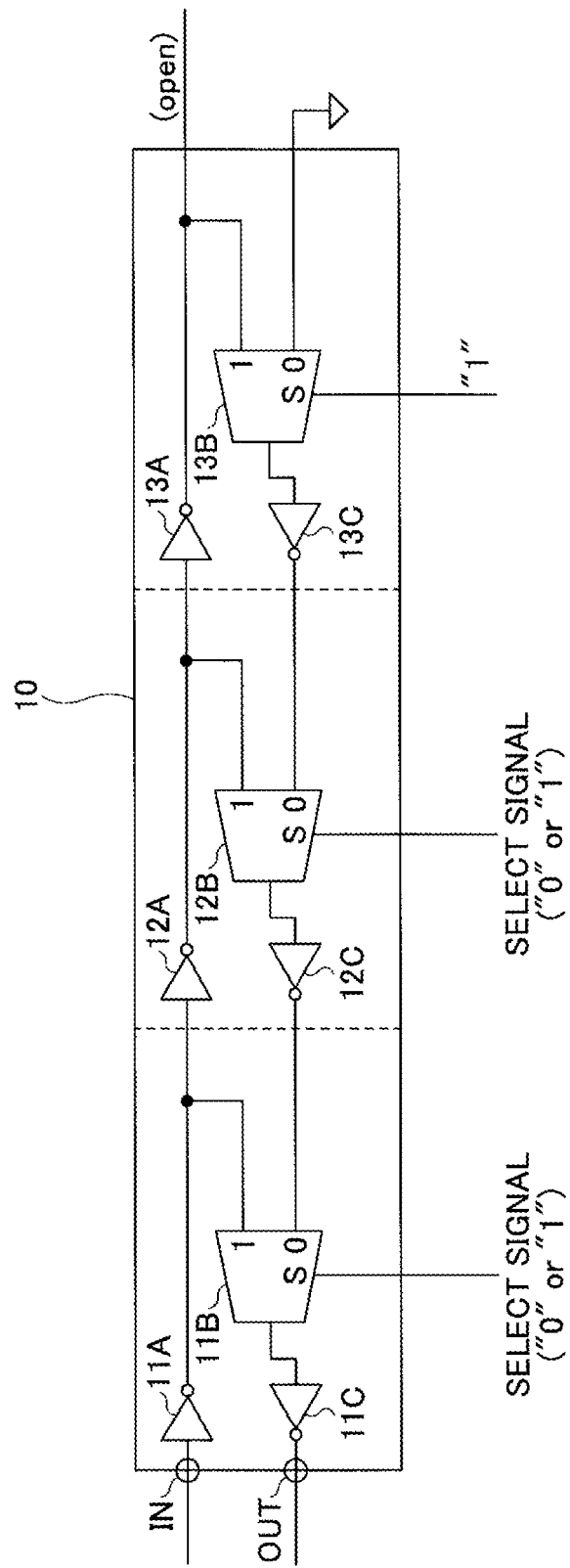

FIG.13A d_frequency[3:0]: 0 | 1 | 2 | 3 | 4 | 5 | 6 | 7 | 8 | 9 | 10 | 11 | 12 | 13 | 14 | 15

FREQUENCY [MHz]: 85 87 89 91 93 95 97 99 101 103 105 107 109 111 113 frequency[2:0]: 0 | 1 | 2 | 3 | 4 | 5 | 6 | 7

87 91 95 99 103 107 111

FIG.13B d_temperature[3:0]: 0 | 1 | 2 | 3 | 4 | 5 | 6 | 7 | 8 | 9 | 10 | 11 | 12 | 13 | 14 | 15

TEMPERATURE [°C]: −20 −10 0 10 20 30 40 50 60 70 80 90 100 110 120 temperature[2:0]: 0 | 1 | 2 | 3 | 4 | 5 | 6 | 7

−20 0 40 60 80 100

FIG.13C d_power_range[3:0]: 0 | 1 | 2 | 3 | 4 | 5 | 6 | 7 | 8 | 9 | 10 | 11 | 12 | 13 | 14 | 15

POWER SUPPLY VOLTAGE RANGE [%]: ±0 ±1 ±2 ±3 ±4 ±5 ±6 ±7 ±8 ±9 ±10 ±11 ±12 ±13 ±14 power_range[2:0]: 0 | 1 | 2 | 3 | 4 | 5 | 6 | 7

±0 ±2 ±4 ±6 ±8 ±10 ±12

FIG.13D d_jitter_range[3:0]: 0 | 1 | 2 | 3 | 4 | 5 | 6 | 7 | 8 | 9 | 10 | 11 | 12 | 13 | 14 | 15

NOISE VOLTAGE [mV]: ±0 ±5 ±10 ±15 ±20 ±25 ±30 ±35 ±40 ±45 ±50 ±55 ±60 ±65 ±70 jitter_range[2:0]: 0 | 1 | 2 | 3 | 4 | 5 | 6 | 7

±0 ±10 ±20 ±30 ±40 ±50 ±60

SEMICONDUCTOR DEVICE AND INFORMATION PROCESSING APPARATUS

CROSS-REFERENCE TO RELATED APPLICATIONS

The present application is a U.S. continuation application filed under 35 USC 111(a) claiming benefit under 35 U.S.C. 120 and 365(c) of PCT International Application No. PCT/JP2011/051463 filed on Jan. 26, 2011, the entire contents of which are incorporated herein by reference.

FIELD

The embodiments discussed herein are related to a semiconductor device and an information processing apparatus.

BACKGROUND

There is disclosed a related art semiconductor device to perform phase compensation exceeding a delay time variable range of a first one of variable delay circuits by switching the first variable circuit into the second one when an output phase of the first variable circuit selected as a clock signal route differs from an output phase of the second variable circuit by one period.

In addition, there is disclosed another related art semiconductor device to prevent a phase comparator from excessively fluctuating following jitter by utilizing a majority circuit to decide the majority of phase comparison results.

RELATED ART DOCUMENTS

Patent Document

Patent Document 1: Japanese Laid-open Patent Publication No. 2001-075671
Patent Document 2: Japanese Laid-open Patent Publication No. 2005-033392

Those related art semiconductor devices each include plural variable delay circuits or majority circuits and majority decision count setting registers, which may increase the size of the semiconductor device, and may cause the delay of a feedback loop.

SUMMARY

According to an aspect of an embodiment, there is provided a semiconductor device that includes a delay part configured to assign a delay to an input signal; a phase detector configured to detect a phase of an output signal output from the delay part; a setting part configured to set a stable operations range of the phase of the output signal based on phase information output from the phase detector; and an error detector configured to set an acceptable range corresponding to the stable operations range, determine whether a phase of the output signal falls within the acceptable range, and change the acceptable range based on an extraneous factor of an input signal of the delay part.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

Other objects, features, and advantages of the present invention will become more apparent from the following detailed description when read in conjunction with the accompanying drawings.

BRIEF DESCRIPTION OF DRAWINGS

FIG. 2 is a diagram illustrating a delay part 10 contained in the comparative example of the signal delay circuit 1;

FIGS. 13A to 13D are diagrams each illustrating a counterpart relationship between an input signal value and an output signal value of the control register 150 of the signal delay circuit 100 included in the semiconductor device of the first embodiment;

DESCRIPTION OF EMBODIMENTS

It may be desirable to provide a semiconductor device capable of securing stable operations and higher responsiveness with a simple configuration, and an information processing apparatus having such a semiconductor device.

Preferred embodiments of the present invention will be described with reference to the accompanying drawings. Specifically, description is given of embodiments of a semiconductor device, and an information processing apparatus.

First, a signal delay circuit included in a comparative example of a semiconductor device will be described with reference to FIGS. 1 and 2, and FIGS. 3A to 3C before illustration of a semiconductor device and an information processing apparatus of a first and a second embodiments.

Figure 1:
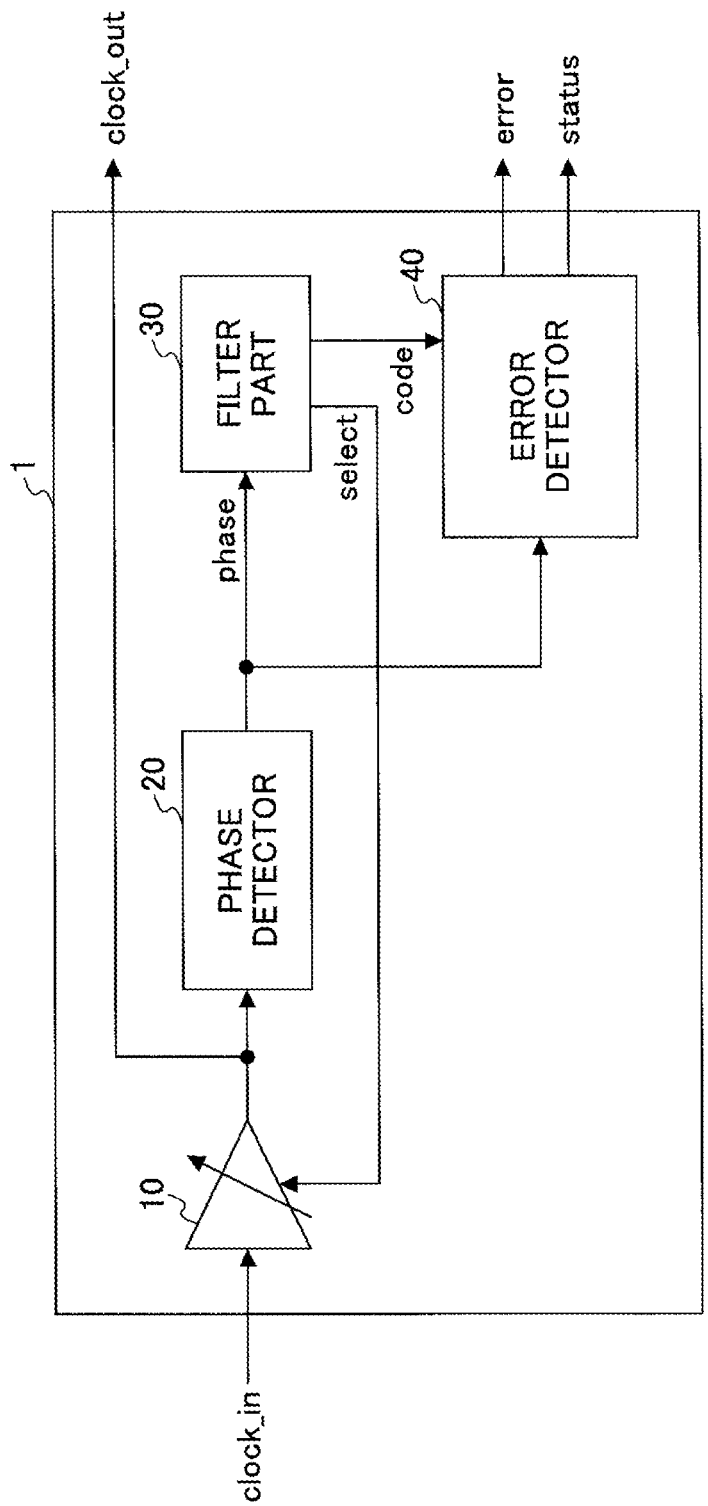
FIG. 1 is a block diagram illustrating a comparative example of a signal delay circuit 1.

FIG. 1 is a block diagram illustrating a comparative example of a signal delay circuit 1.

The comparative example of the signal delay device 1 may, for example, be implemented by a semiconductor device such as a large scale integrated circuit (LSI).

The signal delay circuit 1 includes a delay part 10, a phase detector 20, a filter part 30, and an error detector 40.

The delay part 10 is configured to assign a delay to an input clock (clock_in) to output the delayed input signal as an output clock (clock_out). The delay time that the delay part 10 assigns to the input clock is variably set based on a selection signal input from a filter part 30. The output clock output from the delay part 10 is input into a phase detector 20 as well as being output as an output of the signal delay circuit 1.

The phase detector 20 is configured to detect a phase of the output clock output from the delay part 10, and output a phase signal (phase) representing the phase of the output clock to the filter part 30 and the error detector 40. The phase detector 20 may, for example, detect a rising phase for every clock period.

The filter part 30 is configured to maintain a target value of the phase of the output clock output from the delay part 10, and set a stable operations range of the phase of the output clock output from the delay part 10. The stable operations range set by the filter part 30 includes a predetermined width having the target value of the phase of the output clock output from the delay part 10 as an approximately middle value.

The filter part 30 is further configured to eliminate a clock having a phase deviated from its stable operations range, among others having phase signals (phase) representing the phases of the clocks input from the phase detector 20 for every clock period. The filter part 30 is further configured to return a select signal (select) for adjusting an amount of delay in the delay part 10 based on the difference between a phase of each of the clocks within the stable operations range and the target value of the phase of the output clock. The filter part 30 is further configured to output a code signal (code) representing the stable operations range.

The error detector 40 is configured to set the acceptable range corresponding to the stable operations range based on the code signal (code) representing the stable operations range, and determine whether the phase of the output clock output from the delay part 10 falls within the acceptable range.

The error detector 40 is further configured to set an acceptable range having a range identical to the stable operations range set by the filter part 30. Hence, the error detector 40 may be able to determine whether the phase of the clock detected by the phase detector 20 deviates from the stable operations range set by the filter part 30.

The phase detector 40 may, for example, output a status signal (status) having a code signal (code) representing an upper limit and a lower limit of the acceptable range and a phase signal (phase) representing a phase of the clock. Further, when the error detector 40 determines that the phase of the clock detected by the phase detector 20 deviates from the stable operations range, the error detector 40 outputs an error signal (error) representing error generation. The status signal (status) and the error signal (error) are transmitted to a monitoring system of a system including a signal delay circuit 1.

As described above, the comparative example of the signal delay circuit 1 assigns a delay to an input clock (clock_in) to output an output clock (clock_out) having a phase in accordance with the target value.

FIG. 2 is a diagram illustrating a delay part 10 included in the comparative example of the signal delay circuit 1.

The delay part 10 includes inverters 11A, 12A and 13A, selectors 11B, 12B and 13B, and inverters 11C, 12C and 13C.

The inverters 11A to 13A serve as forwarding inverters configured to propagate signals to selectors 11B to 13B serving as signal turning points. The inverters 11C to 13C serve as returning inverters configured to propagate the signals returned from the selectors 11B to 13B.

The inverters 11A to 13A serve as respective NOT circuits (i.e., inverter circuits) configured to invert input signals to output inverted signals.

The inverters 11A to 13A may represent examples of delay devices connected in series by having their output terminals connected to their input terminals. The input terminal of the inverter 11A is connected to an input terminal IN of the delay part 10, and the output terminal of the inverter 13A has an open end (open) while being connected to a first input terminal of the selector 13B.

The selectors 11B to 13B are disposed corresponding to the inverters 11A to 13A. Each of the selectors 11B to 13B has two input terminals and a selection signal input terminal S, and is configured to select one of the input signals based on a selection signal input to the selection signal input terminal S to output the selected signal.

In this configuration, a selection signal "1" or "0" is input from the filter part 30 into the respective selection signal input terminals S of the selectors 11B and 12B. Further, a selection signal exhibiting a signal level clipped at "1" is input into the selection signal input terminal S of the selector 13B. For example, a predetermined voltage representing the signal level "1" of the selection signal may be generated by causing a resistor or the like to convert a power supply voltage, and the generated selection signal exhibiting the signal level "1" may be input into the selection signal input terminal S of the selector 13B.

Hence, each of the selectors 11B and 12B may select a selection signal (i.e., "1" or "0") input from the filter part 30, and output the selected signal whereas the selector 13B may constantly select an output signal from the inverter 13A and output the selected output signal.

The inverters 11C to 13C serve as NOT circuits (i.e., inverter circuits) configured to invert input signals to output inverted signals, and are disposed corresponding to the selectors 11B to 13B. The inverters 11C to 13C are alternately connected to the selectors 11B to 13B in series. The inverters 11C to 13C may invert output signals of the selectors 11B to 13B and output the inverted signals. The inverters 11C to 13C are examples of the delay devices.

The output terminal of the inverter 13A may be connected to a first input terminal of the selector 13B. A second input terminal of the selector 13B is grounded, and "0" is input as fixed data into the second input terminal of the selector 13B.

The output terminal of the inverter 12A is connected to a first input terminal of the selector 12B, and an output terminal of the inverter 13C is connected to a second input terminal of the selector 12B.

The output terminal of the inverter 11A is connected to a first input terminal of the selector 11B, and an output terminal of the inverter 12C is connected to a second input terminal of the selector 11B.

The output terminal of the selector 11B is connected to an input terminal of the inverter 11C, and an output terminal of the inverter 11C is connected to an output terminal OUT of the delay part 10.

The delay part 10 adjusts a delay time of the signal input into the input terminal IN based on one of the selectors 11B and 12B from which the signal input into the input terminal IN is returned, and outputs the adjusted signal from the output terminal OUT.

Note that, as described above, since the selection signal having the signal level clipped at "1" is input into the selection signal input terminal S of the selector 13B, which is disposed at a longest distance from the input terminal IN of the delay part 10, the selector 13B constantly selects the output signal of the inverter 13A.

In the signal delay circuit 1 included in the comparative example of the semiconductor device, when the selection signals input into the selectors 11B and 12B are "0" and "0", respectively, the selectors 11B and 12B select output signals of the inverters 12C and 13C, respectively. Hence, the selector 13B serves as the signal turning point in the delay part 10.

When the selection signals input into the selectors 11B and 12B are "0" and "1", respectively, the selector 11B selects an output signal of the inverter 12C whereas the selector 12B selects an output signal of the inverter 12A. Hence, the selector 12B servers as the signal turning point in the delay part 10.

Note that in this case, the selector 13B selects the output signal of the inverter 13A and inputs the selected signal into the inverter 13C. However, the output signal of the inverter 13C is not selected by the selector 12B, and hence, the selector 13B will not serve as the signal turning point.

When the selection signals input into the selectors 11B and 12B are "1" and "0", respectively, the selector 11B selects an output signal of the inverter 11A. Hence, the selector 11B servers as the signal turning point in the delay part 10.

Note that in this case, the selector 13B selects the output signal of the inverter 13A and inputs the selected signal into the inverter 13C, and the output signal of the inverter 13C is selected by the selector 12B. However, the output signal of the inverter 12C is not selected by the selector 11B, and hence, the selector 13B will not serve as the signal turn-round point.

Note that the delay part 10 including three-staged inverters 11A, 12A and 13A, selectors 11B, 12B and 13B, and inverters 11C, 12C and 13C is illustrated above as an example of the embodiment. However, the numbers of stages of the forwarding inverters and returning inverters may be determined based on an amount of delay assigned to the clock.

For example, when an output signal of the clock assigned with a phase of 180 degrees is output, the amount of delay may be determined in stages based on 257-staged forwarding inverters, returning inverters, and selectors utilizing a 8-bit selection signal.

In this case, the 8-bit selection signal output by the filter part 30 may be converted into a 256-bit selection signal, and the converted 256-bit selection signal may be input into 256 selectors among the 257-staged selectors excluding the selectors disposed at the longest distance from the input terminal IN and the output terminal OUT of the delay part 10. Note that in this case, a selection signal having a fixed signal value may be input into the selectors disposed at the longest distance from the input terminal IN and the output terminal OUT of the delay part 10 so as to constantly return the input selection signal.

Further, FIG. 2 illustrates as an example, the delay part 10 having a circuit configuration in which the signal transferred to the forwarding inverters is returned by the selector and the returned signal is output via the returning inverters. However, the configuration of the delay part 10 is not limited to the circuit configuration in which the signal is returned by the selector. The delay part 10 may have any other circuit configuration insofar as a delay is assigned to the input signal to output the delay signal.

Next, a description is given of a phase of a clock (hereinafter also called a "clock phase") detected by the phase detector 20, the stable operations range set by the filter part 30, and the acceptable range set by the error detector 40 with reference to FIGS. 3A to 3C. Note that in FIGS. 3A to 3C, a clock phase is represented by dots.

Figure 3A:
FIG. 3A is a schematic diagram illustrating a relationship between a clock phase and a stable operations range, where the clock phase is represented by a phase signal (phase) input into a filter part 30 of the comparative example of the signal delay circuit 1.

FIG. 3A is a schematic diagram illustrating a relationship between the clock phase represented by the phase signal (phase) input into the filter part 30 of the comparative example of the signal delay circuit 1 and the stable operations range. The dots representing a phase in FIG. 3A is a clock phase before filter processing is performed by the filter part 30, that is, the dot represents a phase detected by the phase detector 20.

Figure 3B:
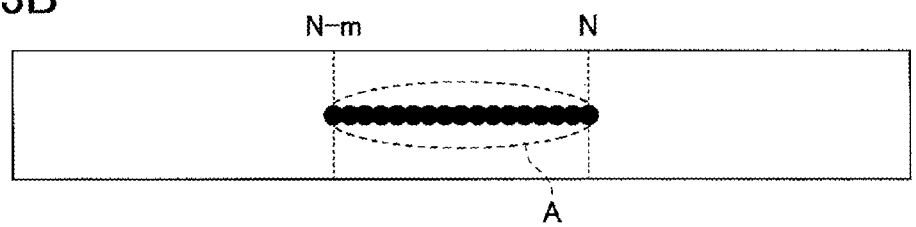
FIG. 3B is a schematic diagram illustrating a relationship between a clock phase and the stable operations range, where the clock phase is obtained after filter processing performed by the filter part 30.

FIG. 3B is a schematic diagram illustrating a relationship between the clock phase after the filter processing performed by the filter part 30 and the stable operations range.

Figure 3C:
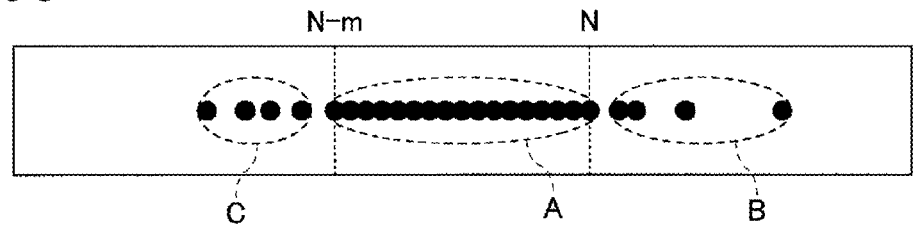
FIG. 3C is a schematic diagram illustrating a relationship between an acceptable range and the clock phase in an error detector 40.

FIG. 3C is a schematic diagram illustrating a relationship between the acceptable range of the error detector 40 and the clock phase.

Note that N represents upper limits of the stable operations range and the acceptable range, and m represents the width of the stable operations range and the acceptable range. The target value of the clock phase maintained by the filter part 30 may be represented by $N-(m/2)$.

The filter part 30 determines the upper limit N and the width m of a first acceptable range based on a distribution of the clock phase represented by the phase signal (phase) input into the filter part 30 such that the signal delay circuit exhibit appropriate operating behaviors. Note that the filter part 30 may determine the upper limit N and the width m of the first acceptable range based on the target value.

As illustrated in FIG. 3A, most of the clock phases detected by the phase detector 20 may fall within the stable operations range (N-m to N) from the target value as the middle (mean).

The clock phases deviated from the stable operations range (N-m to N) may, for example, be observed due to abnormal operations of the delay part 10, or abnormal behaviors of the clocks. However, the clock phases deviated form the stable operations range (N-m to N) may also be observed due to the clock frequency, the temperature of the delay part 10, or the variations of the power supply voltage of the delay part 10.

As described above, the clock phases may be deviated from the stable operations range (N-m to N) due to a factor (an extraneous factor) outside the signal delay circuit 1 or a factor (an extraneous factor) outside the semiconductor device including the signal delay circuit 1.

Since the clock phase deviated from the stable operations range (N-m to N) are eliminated from the filter processing of the filter par 30, the clock phase after the filter processing falls within the stable operations range (N-m to N) as indicated by an oval broken line A in FIG. 3B.

Further, the error detector 40 includes an acceptable range (N-m to N) identical to that of the filter part 30. Hence, when the phase signal (phase) representing the clock phase illustrated in FIG. 3C is input from the phase detector 20 to the error detector 40, the error detector 40 determines that the signal delay circuit 1 or the semiconductor device including the signal delay circuit 1 exhibits normal operating behaviors when the clock phase falls within the acceptable range (N-m to N). However, the error detector 40 determines that the signal delay circuit 1 or the semiconductor device including the signal delay circuit 1 exhibits abnormal operating behaviors when the clock phase deviates from the acceptable range (N-m to N).

That is, the error detector 40 determines that the clock phases that fall within the acceptable range (N-m to N) indicated by an oval broken line A in FIG. 3C is normal whereas the error detector 40 determines that the clock phases that fall within the oval broken lines A and C in FIG. 3C are abnormal.

When the error detector 40 determines that the abnormal operation has occurred, an error signal is transferred to a monitoring system of a system including the signal delay circuit 1. Hence, operations of the system including the signal delay circuit 1 may be terminated.

Among the cases where the clock phase input into the signal delay circuit 1 exhibits variations due to the extraneous factors such as the clock frequency, the temperature of the signal delay circuit 1, variations of the power supply voltage, there may be some cases where the variations of the clock phase will not adversely affect operations of the system including the signal delay circuit 1 without having the error determination conducted by the error detector 40.

For example, when the occurrence frequency of the extraneous factor is extremely low (e.g., less than 1%), or when data are monitored outside the signal delay circuit 1, the operations of the system including the signal delay circuit 1 will not be affected adversely without having the error determination.

Note that a case where data are monitored outside the signal delay circuit 1 may be a case where data with an Error-Correcting Code (ECC) are transferred or data with an enable signal are transferred via a bus, via which data are transferred in synchronization with the input clock (clock_in), for example.

Further, a case where the clock phase is varied by the extraneous factor and is thus deviated from the acceptable range of the error detector 40 may, for example, be a few percent or less in probability (e.g. a few to several tens of detected cases out of 10,000 detected cases). Hence, such cases are extremely small in number in the overall clock phases.

Accordingly, when the number of clock phases varied due to the extraneous factor is relatively small, it may be advantageous to allow the system including the signal delay circuit 1 to continue its operations without having the error detector 40 to perform the error determination so as to stably operate the entire system without interruption.

As described above, in the semiconductor device including the comparative example of the signal delay circuit 1, the error is uniformly determined (detected) when the clock phase is deviated from the acceptable range due to the extraneous factor. Hence, the information processing apparatus such as a server including the signal delay circuit 1 may need to be terminated, which may inhibit the entire system from exhibiting stable operations without interruption.

Accordingly, first and second embodiments described below may provide a semiconductor device and an information processing apparatus that may overcome limitations and disadvantages of the comparative example of the semiconductor device. In the following, a description will be given of the semiconductor device of the first and the second embodiments, and an information processing apparatus having such semiconductor devices.

First Embodiment

In the following description, elements of the semiconductor device of the first embodiment that are the same as or equivalent to those of the comparative example are designated by the same reference numerals, and a description of such elements of the semiconductor device of the first embodiment will be omitted.

Figure 4:
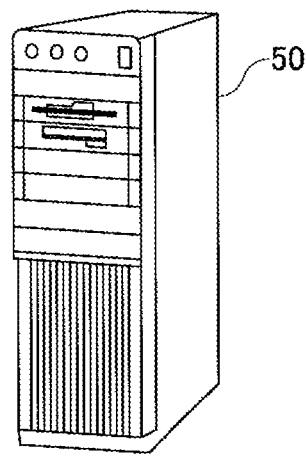
FIG. 4 is a diagram illustrating a server 50 including a semiconductor device of a first embodiment.

FIG. 4 is a diagram illustrating a server 50 including the semiconductor device of the first embodiment.

The server 50 illustrated in FIG. 4 may be an example of the information processing apparatus including the semiconductor device of the first embodiment. The server 50 may, for example, include a central processing unit (CPU), a main storage unit, and the like.

Figure 5:
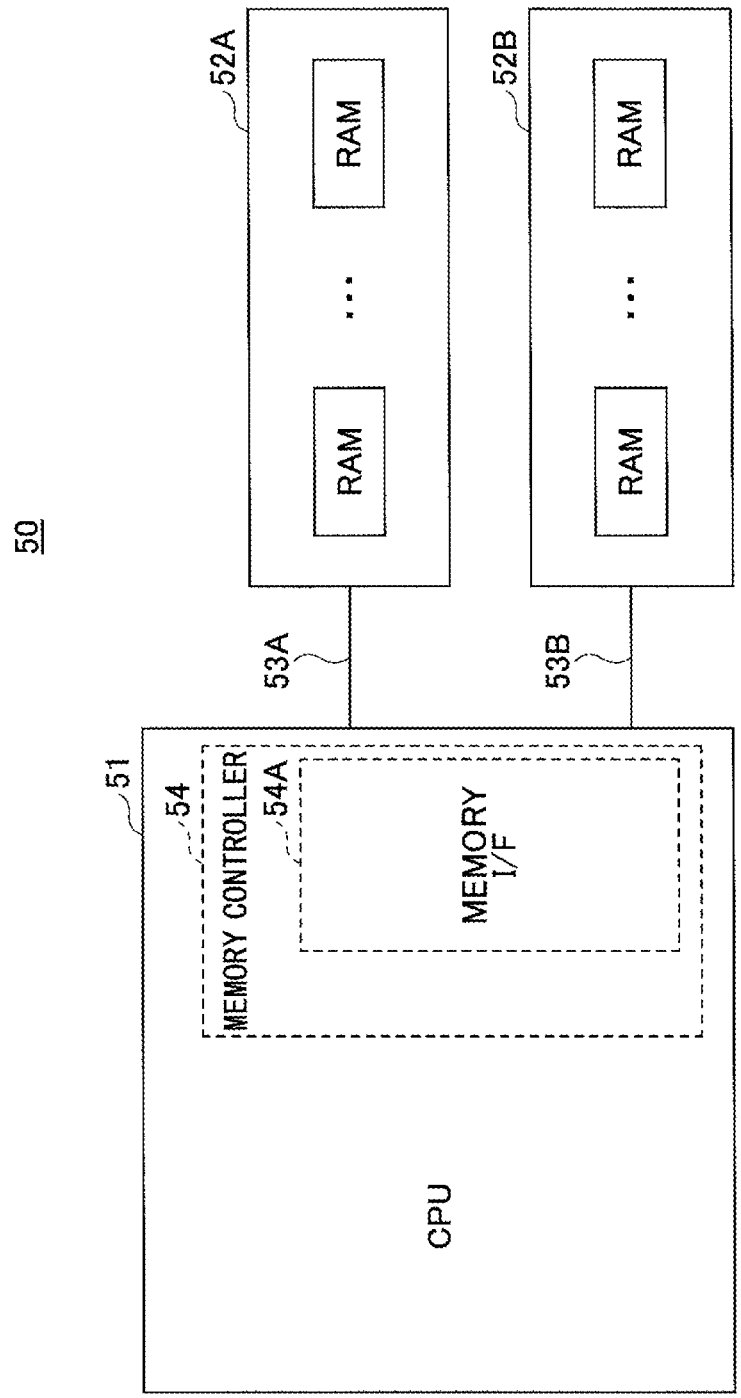
FIG. 5 is a block diagram illustrating the server 50 including the semiconductor device of the first embodiment.

FIG. 5 is a block diagram illustrating the server 50 including the semiconductor device of the first embodiment.

The server 50 includes a CPU 51, and main storage units 52A and 52B. The CPU 51 and the main storage units 52A and 52B are connected via buses 53A and 53B, respectively.

The CPU 51 includes a memory controller 54 and is configured to acquire or transfer data between the main storage units 52A and 52B via a memory interface (I/F) 54A within the memory controller 54 while carrying out a process on the acquired data.

Each of the main storage units 52A and 52B may, for example, include a plurality of modulated random access memories (RAMs). Note that the example of the server 50 in FIG. 5 includes two main storage units 52A and 53B; however, the server 50 may include three or more main storage units.

The memory controller 54 transfers data between the CPU 51 and each of the main storage units 52A and 52B. The memory controller 54 includes the memory interface (I/F) 54A for implementing data communications at an interface between the main storage units 52A and 52B.

The semiconductor device of the first embodiment may, for example, serve as the memory controller 54 that includes a signal delay circuit within the memory I/F 54A. FIG. 5 illustrates a configuration of the server 50 in which the CPU 51 includes the memory controller 54; however, the memory controller 54 may be disposed outside the CPU 51. Alternatively, the semiconductor device of the first embodiment may be a chip set including the memory controller 54.

Note that the signal delay circuit included in the semiconductor device of the first embodiment may be an example of the signal delay device configured to output an output signal obtained by assigning a delay time to an input signal. The output signal of the signal delay circuit included in the semiconductor device of the first embodiment may, for example, be used as a system clock for the memory controller 54 serving as the semiconductor device of the first embodiment to carry out data transfer between the main storage units 52A and 52B.

Next, a description will be given, with reference to FIG. 6, of a signal delay circuit 100 included in the semiconductor device of the first embodiment.

Figure 6:
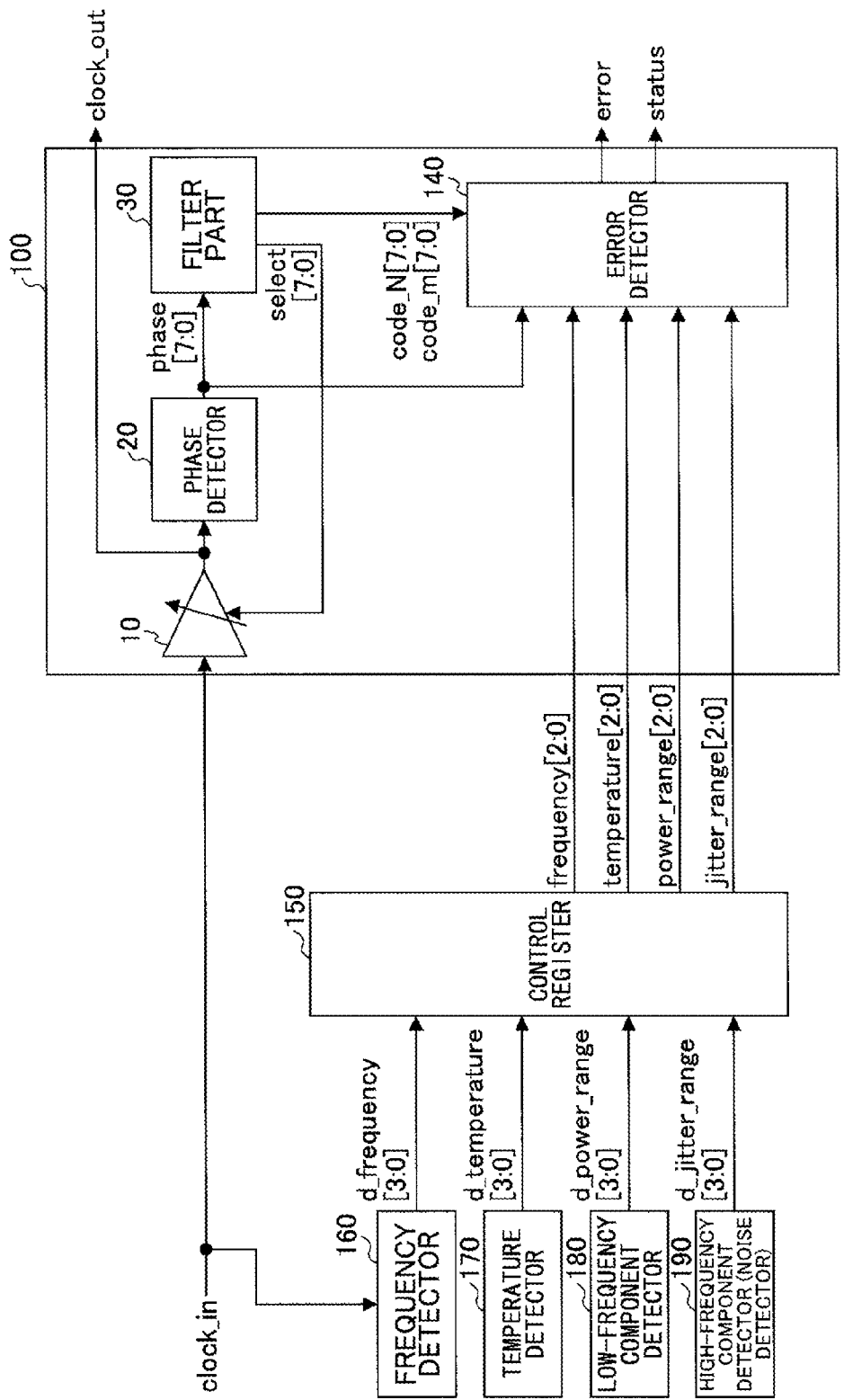
FIG. 6 is a diagram illustrating a signal delay circuit 100 included in the semiconductor device of the first embodiment.

FIG. 6 is a diagram illustrating the signal delay circuit 100 included in the semiconductor device of the first embodiment.

The signal delay circuit 100 includes an error detector 140 having a configuration differing from that of the error detector 40 in the signal delay circuit 1 of the comparative example. In addition, in the signal delay circuit 100, a phase detector 20 outputs an 8-bit phase signal phase[7:0], a filter part 30 outputs an 8-bit select signal select [7:0] and 8-bit code signals code_N[7:0] and code_m[7:0] representing the stable operations range.

Other configurations of the elements of the signal delay circuit 100 are the same as those of the elements of the comparative example of the signal delay circuit 1. Hence, the signal delay circuit 100 outputs an output clock signal (clock_out) obtained by assigning a delay to an input clock (clock_in) input into a delay part 10.

In the following, the elements of the signal delay circuit 100 of the semiconductor device of the first embodiment that are the same as or equivalent to those of the delay circuit 1 of the comparative example are designated by the same reference numerals, and their descriptions will therefore be omitted from the specification of the present application.

Initially, a phase detector 20 is illustrated with reference to FIG. 7.

Figure 7:
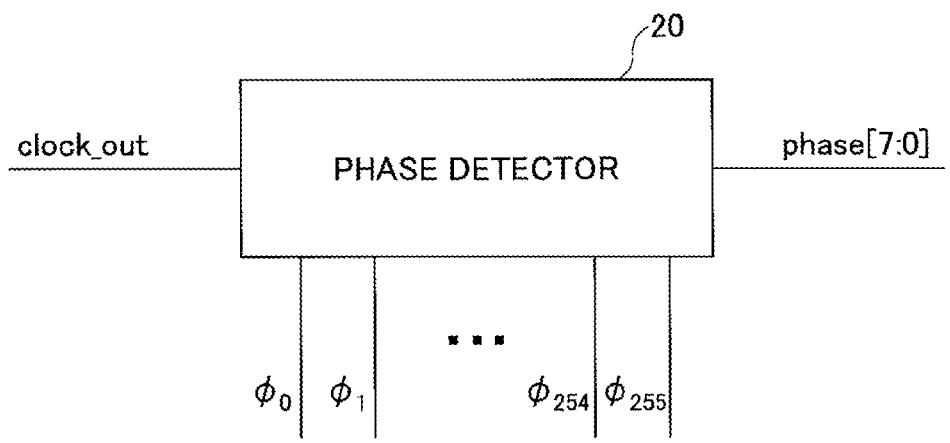
FIG. 7 is a diagram illustrating a phase detector 20 of the signal delay circuit 100 included in the semiconductor device of the first embodiment.

FIG. 7 is a diagram illustrating the phase detector 20 of the signal delay circuit 100 included in the semiconductor device of the first embodiment.

The phase detector 20 is supplied with the output clock (clock_out) output from the delay part 10. The phase detector 20 is further supplied with polyphase clocks φ0 to φ255. The polyphase clocks φ0 to φ255 are obtained by dividing one period of an input clock (clock_in) into 256 to produce unit-phases, and sequentially assigning each of the unit phases to the input clock (clock_in).

The clock φ0 includes a phase the same as the phase of the input clock (clock_in), the clock φ1 includes a phase one unit-phase shifted forward from the phase of the input clock (clock_in), the clock φ254 includes a phase 254 unit-phases shifted forward from the phase of the input clock (clock_in), and the clock φ255 includes a phase 255 unit-phases shifted forward from the phase of the input clock (clock_in).

The phase detector 20 is configured to compare the output clock with each of the polyphase clocks φ0 to φ255, and detect one of the polyphase clocks φ0 to φ255 having a phase matching a phase of the output clock (clock_out) output from the delay part 10 as a phase of the output clock (clock_out).

The phase detector 20 is further configured to output an 8-bit phase signal phase[7:0] representing the detected phase.

Next, a description is given of the error detector 140.

The error detector 140 differs from the error detector 40 of the comparative example of the signal delay circuit 1 in that the acceptable range is changed based on the factor (extraneous factor) generated outside the signal delay circuit 100 or the semiconductor device included in the signal delay circuit 100. Details of the acceptable range changed by the error detector 140 will be described later with reference to FIGS. 14A to 17E.

Note that the clock phases may be deviated from the stable operations range (N-m to N) due to a factor outside the signal delay circuit 100 or a factor outside the semiconductor device including the signal delay circuit 100 (an extraneous factor). Examples of such an extraneous factor include a clock frequency, the temperature of the signal delay circuit 100, and the variation of the power supply voltage. The variation of the power supply voltage includes a low frequency component wander and a high frequency component jitter.

The error detector 140 is connected to a frequency detector 160, a temperature detector 170, a low-frequency component detector 180, and a high-frequency component detector 190 via a control register 150.

The frequency detector 160, the temperature detector 170, the low-frequency component detector 180, and the high-frequency component detector 190 are each configured to detect the frequency of the clock, the temperature of the signal delay circuit 100, wander representing the variation of the power supply voltage, and jitter contained in the power supply voltage as extraneous factors.

The frequency detector 160 is configured to detect the frequency of the clock, digitally convert the detected frequency of the clock into 4-bit frequency signal d_frequency [3:0]. A frequency detector illustrated in FIG. 8 may, for example, be used as the frequency detector 160.

Figure 8:
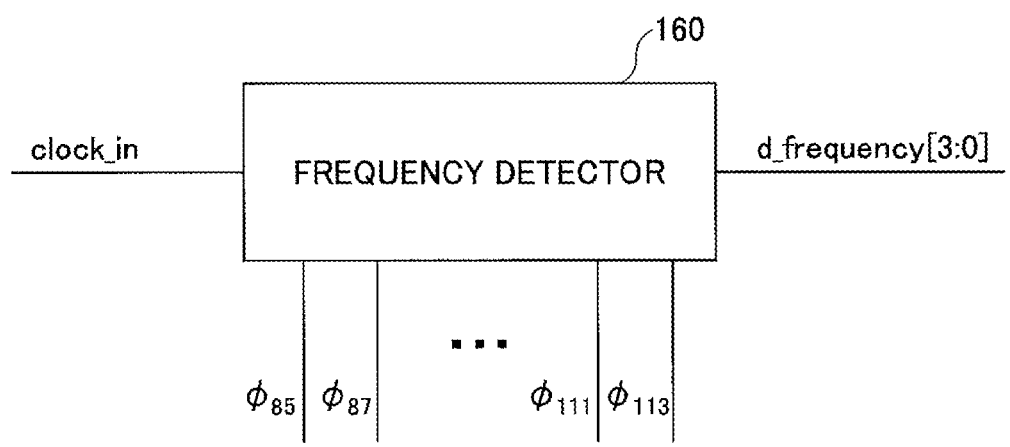
FIG. 8 is a diagram illustrating a frequency phase detector 160 of the signal delay circuit 100 included in the semiconductor device of the first embodiment.

FIG. 8 is a diagram illustrating the frequency detector 160 of the signal delay circuit 100 included in the semiconductor device of the first embodiment.

The frequency detector 160 is supplied with the branched input clock (clock_in) input into the delay part 10. Note that the frequency detector 160 may, for example, be configured to detect a frequency range of 85 to 113 (MHz). The phase detector 160 is further supplied with polyphase clocks φ85 to φ113.

The polyphase clocks φ85 to φ113 are 29 clocks to each of which the frequency from 85 to 113 MHz is sequentially assigned per MHz.

The frequency detector 160 is configured to compare the input clock (clock_in) with each of the polyphase clocks φ85 to φ113, and detect one of the polyphase clocks φ85 to φ113 having periodicity matching periodicity of the intput clock (clock_in).

The temperature detector 170 is attached to the delay part 10, and configured to detect the temperature of the delay part 10, digitally convert the detected temperature of the delay part 10 into O-bit frequency signal d_temperature[3:0]. In FIG. 6, the temperature detector 170 and the delay part 10 are separately illustrated; however, the temperature detector 170 is actually disposed close to the delay part such that the temperature detector 170 is able to detect the temperature of the delay part 10.

The low-frequency component detector 180 is configured to detect wander representing the variation of the power supply voltage of the delay part 10, and convert the detected wonder digitally so as to output a 4-bit power supply voltage signal d_power_range[3:0] representing a voltage value of the wander contained in the power supply voltage of the delay part 10. A low-frequency component detector illustrated in FIG. 9 may, for example, be used as the low-frequency component detector 180.

Figure 9:
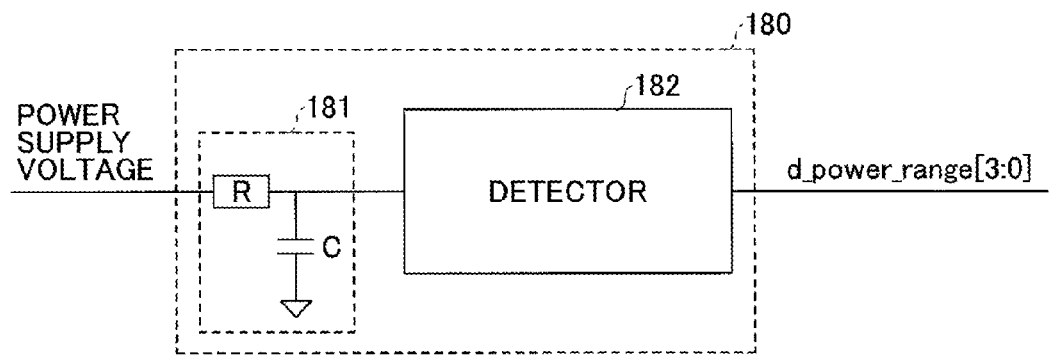
FIG. 9 is a diagram illustrating a low-frequency component detector 180 of the signal delay circuit 100 included in the semiconductor device of the first embodiment.

FIG. 9 is a diagram illustrating the low-frequency component detector 180 of the signal delay circuit 100 included in the semiconductor device of the first embodiment.

The low-frequency component detector 180 includes a lowpass filter part 181, and a detector 182. The lowpass filter part 181 includes a resistor R inserted in series with a line supplied with the power supply voltage, and a capacitor C inserted between the line supplied with the power supply voltage and the ground.

The detector 182 is connected to an output side of the lowpass filter part 181, and configured to detect a low frequency component passing through the lowpass filter part 181 among the power supply voltage components, and output a power supply voltage signal d_power_range[3:0] representing the variation of the power supply voltage.

The high-frequency component detector 190 is configured to detect jitter contained in the power supply voltage of the delay part 10, and convert the detect jitter digitally so as to output a 4-bit jitter signal d_jitter_range[3:0] representing a voltage value of the jitter contained in the power supply voltage of the delay part 10. A high-frequency component detector illustrated in FIG. 10 may, for example, be used as the high-frequency component detector 190.

Figure 10:
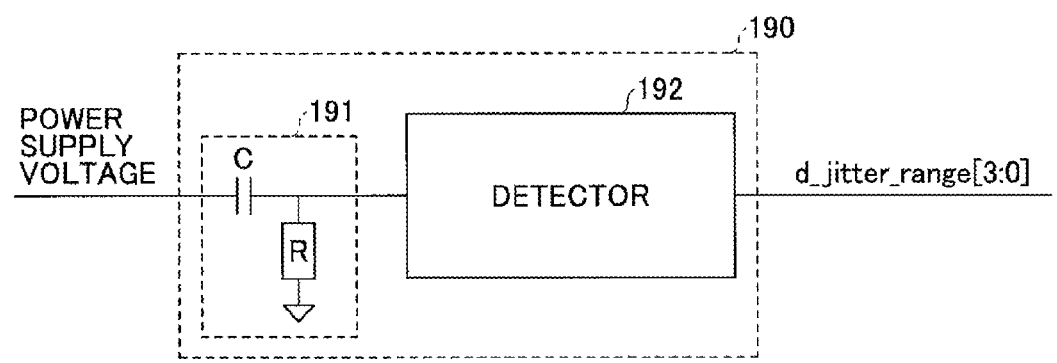
FIG. 10 is a diagram illustrating a high-frequency component detector 190 of the signal delay circuit 100 included in the semiconductor device of the first embodiment.

FIG. 10 is a diagram illustrating the high-frequency component detector 190 of the signal delay circuit 100 included in the semiconductor device of the first embodiment.

The high-frequency component detector 190 includes a highpass filter part 191, and a detector 192. The highpass filter part 191 includes a capacitor C inserted in series with a line supplied with the power supply voltage, and a resistor R inserted between the line supplied with the power supply voltage and the ground.

The detector 192 is connected to an output side of the highpass filter part 191, and configured to detect a high frequency component passing through the highpass filter part 191 among the power supply voltage components, and output a 4-bit jitter signal d_jitter_range[3:0] representing the variation of the power supply voltage.

Next, a description will be given of the control register 150 with reference to FIGS. 6 and 11.

As illustrated in FIG. 6, the control register 150 is supplied with a frequency signal d_frequency[3:0], a temperature signal d_temperature[3:0], a power supply voltage signal d_power_range[3:0], and a jitter signal d_jitter_range[3:0] from the frequency detector 160, the temperature detector 170, the low-frequency component detector 180, and the high-frequency component detector 190, respectively.

Figure 11:
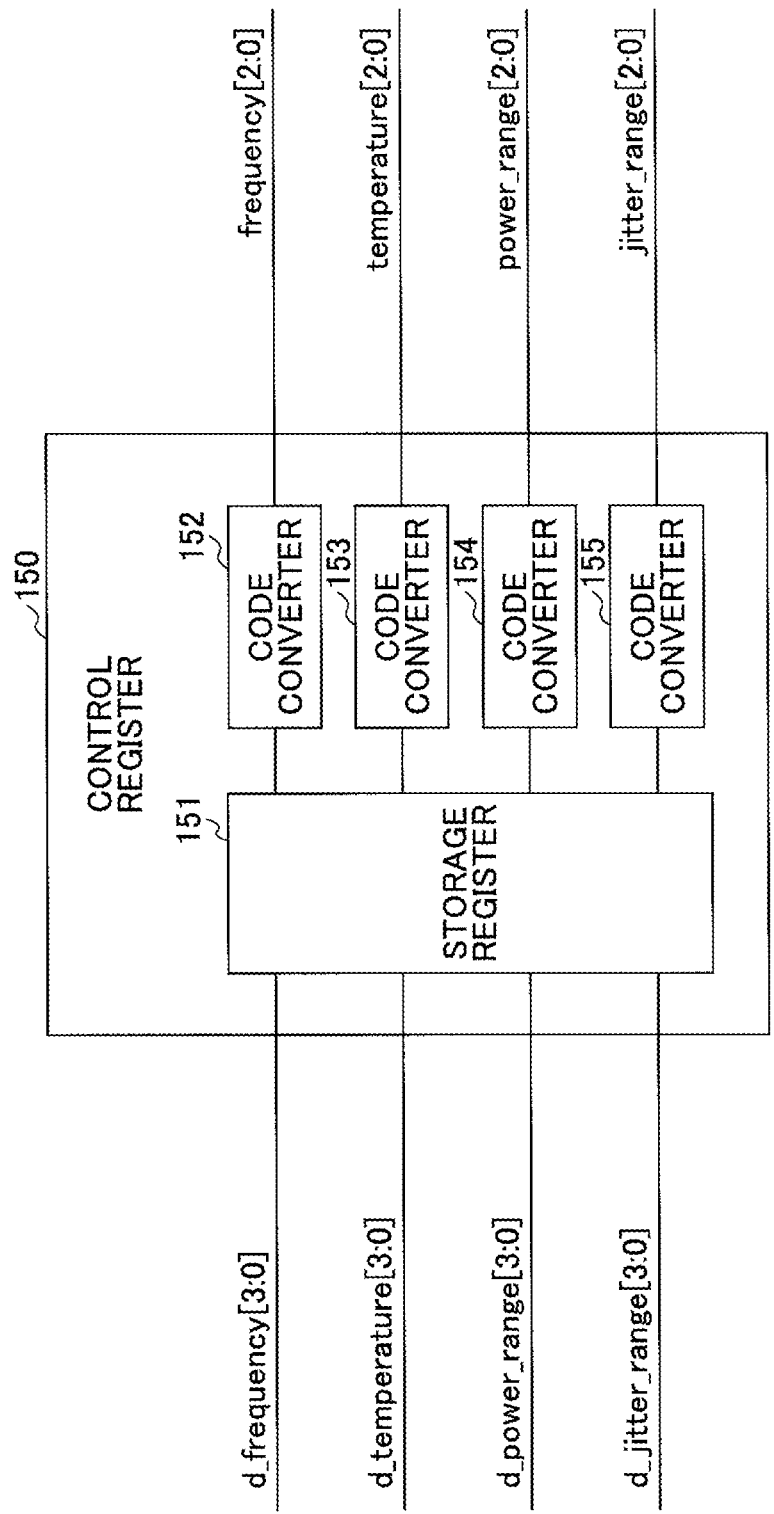
FIG. 11 is a diagram illustrating a control register 150 of the signal delay circuit 100 included in the semiconductor device of the first embodiment.

A high-frequency component detector illustrated in FIG. 11 may, for example, be used as the control register 150.

FIG. 11 is a diagram illustrating a control register 150 of the signal delay circuit 100 included in the semiconductor device of the first embodiment.

The control register 150 includes a storage register 151 and code converters 152 to 155.

The storage register 151 maintains a 4-bit signal and transfers the maintained 4-bit signal to the code converters 152 to 155. Each of the code converters 152 to 155 includes a combination circuit configured to convert a 4-bit signal into a 3-bit signal so as to convert a 4-bit signal into a 3-bit signal to output the 3-bit signal.

The control register 150 is configured to convert a 4-bit frequency signal, a 4-bit temperature signal, a 4-bit power supply voltage signal, and a 4-bit jitter signal into a 3-bit frequency signal, a 3-bit temperature signal, a 3-bit power supply voltage signal, and a 4-bit jitter signal to output the 3-bit frequency signal, the 3-bit temperature signal, the 3-bit power supply voltage signal, and the 3-bit jitter signal, respectively.

The 3-bit frequency signal, the 3-bit temperature signal, the 3-bit power supply voltage signal, and the 3-bit jitter signal output from the control register 150 are represented by frequency[2:0], temperature[2:0], power_range[2:0], and jitter_range[2:0], respectively.

The 3-bit frequency signal frequency[2:0], the 3-bit temperature signal temperature[2:0], the 3-bit power supply voltage signal power_range[2:0], and the 3-bit jitter signal jitter_range[2:0] are supplied to the error detector 140 of the signal delay circuit 100.

In the following, jitter and wander of the power supply voltage are illustrated with reference to FIG. 12.

Figure 12A:
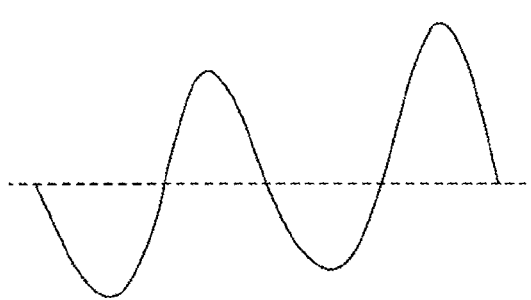
FIG. 12A is a diagram illustrating a typical waveform of wander of a power supply voltage.
Figure 12B:
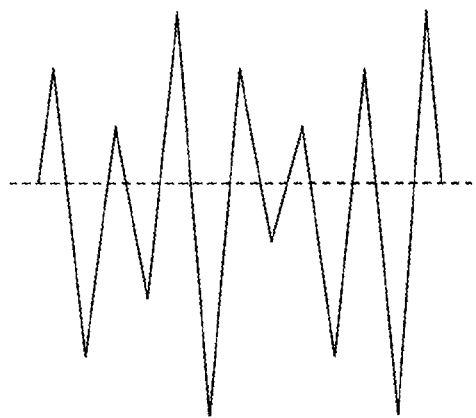
FIG. 12B is a typical waveform of jitter of a power supply voltage.

FIG. 12A is a diagram illustrating a typical waveform of wander of the power supply voltage, and FIG. 12B is a typical waveform of jitter of the power supply voltage. In FIGS. 12A and 12B, the power supply voltage serving as a reference is illustrated by a broken line.

In the signal delay circuit 100 included in the semiconductor device of the first embodiment, wander is defined as periodical variation of a relatively low frequency less than 10 kHz contained in the power supply voltage as an example (see FIG. 12A). The periodicity of the actually detected wander frequency may, for example, be approximately 100 Hz.

In addition, in the signal delay circuit 100 included in the semiconductor device of the first embodiment, jitter is defined as periodical variation of a relatively high frequency of 10 kHz or greater contained in the power supply voltage as an example (see FIG. 12B).

The wander and jitter are examples of the variation of the power supply voltage. The wander is detected by the low-frequency component detector 180 whereas the jitter is detected by the high-frequency component detector 190.

Next, a description will be given of relationships between the 4-bit input signals and their counterpart 3-bit output signals with reference to FIGS. 13A to 13D.

FIGS. 13A to 13D are diagrams each illustrating a counterpart relationship between an input signal value and an output signal value of the control register 150 of the signal delay circuit 100 included in the semiconductor device of the first embodiment.

As illustrated by the counterpart relationships in FIGS. 13A to 13D, the control register 150 is configured to convert a 4-bit frequency signal, a 4-bit temperature signal, a 4-bit power supply voltage signal, and a 4-bit jitter signal into a 3-bit frequency signal, a 3-bit temperature signal, a 3-bit power supply voltage signal, and a 3-bit jitter signal. In the following, the conversion of the frequency signal, the temperature signal, the power supply voltage signal, and the jitter signal are sequentially illustrated.

As illustrated in FIG. 13A, the control register 150 converts a 4-bit frequency signal d_frequency[3:0] into a 3-bit frequency signal frequency[2:0].

FIG. 13A illustrates a conversion table in a range from a frequency less than 85 MHz to a frequency of 113 MHz or greater.

The 4-bit frequency signal d_frequency[3:0] is assigned as follows. That is, as illustrated in FIG. 13A, "0" is assigned to the frequency in a range less than 85 MHz, "1" is assigned to the frequency in a range of 85 MHz or greater to less than 87 MHz, . . . , "14" is assigned to the frequency in a range of 111 MHz or greater to less than 111 MHz, and "15" is assigned to the frequency in a range of 111 MHz or greater.

By contrast, the 3-bit frequency signal frequency[2:0] is assigned as follows. That is, "0" is assigned to the frequency in a range less than 87 MHz, "1" is assigned to the frequency in a range of 87 MHz or greater to less than 91 MHz, . . . , "6" is assigned to the frequency in a range of 107 MHz or greater to less than 111 MHz, and "7" is assigned to the frequency in a range of 111 MHz or greater.

As illustrated in FIG. 13A, the control register 150 converts a 4-bit frequency signal d_frequency[3:0] into a 3-bit frequency signal frequency[2:0] by utilizing the conversion table illustrated in FIG. 13A.

For example, in a case where the frequency indicates 98 MHz and the 4-bit frequency signal d_frequency[3:0] represents "7", the 4-bit frequency signal d_frequency[3:0] is converted into the 3-bit frequency signal frequency[2:0] representing "3".

Next, the conversion of the temperature is illustrated.

As illustrated in FIG. 13B, the control register 150 converts a 4-bit temperature signal d_temperature[3:0] into a 3-bit temperature signal frequency[2:0].

FIG. 13B illustrates a conversion table in a range from the temperature less than −20° C. to the temperature of 120° C. or above.

The 4-bit temperature signal d_temperature[3:0] is assigned as follows. That is, as illustrated in FIG. 13B, "0" is assigned to the temperature in a range less than −20° C., "1" is assigned to the temperature in a range of −20° C. or above to less than −10° C., . . . , "14" is assigned to the temperature in a range of 110° C. or above to less than 120° C., and "15" is assigned to the temperature in a range of 120° C. or above.

By contrast, the 3-bit temperature signal temperature[2:0] is assigned as follows. That is, "0" is assigned to the temperature in a range less than −20° C., "1" is assigned to the temperature in a range of −20° C. or above to less than 0° C., . . . , "6" is assigned to the temperature in a range of 80° C. or above to less than 100° C., and "7" is assigned to the temperature in a range of 100° C. or above.

The control register 150 converts a 4-bit temperature signal d_temperature[3:0] into a 3-bit temperature signal frequency [2:0] by utilizing the conversion table illustrated in FIG. 13B.

For example, in a case where the temperature indicates 45° C. and the 4-bit temperature signal d_temperature[3:0] represents "7", the 4-bit temperature signal d_temperature[3:0] is converted into the 3-bit temperature signal temperature[2:0] representing "4".

Next, the conversion of the variation (wander) of the power supply voltage is illustrated.

As illustrated in FIG. 13C, the control register 150 converts a 4-bit power supply voltage signal d_power_range[3:0] into a 3-bit power supply voltage signal power_range[2:0].

In this case, the variation of the power supply voltage is expressed in percentages with respect to the power supply voltage, and FIG. 13C illustrates a conversion table in a range from the variation of the power supply voltage of 0 to 14% or greater in absolute value.

Note that since the power supply voltage may vary in either of plus (+) and minus (−) side directions, a ±sign is provided with numeric values representing the variation of the power supply voltage in FIG. 13C.

Further, in order to simultaneously illustrate the variations in directions toward a plus (+) side and a minus (−) side (hereinafter also referred to as a "plus (+) side direction" and a "minus (−) side direction"), an absolute value is employed for representing a value of the variation of the power supply voltage. Hence, the counterpart relationship between the 4-bit power supply voltage signal and the 3-bit power supply voltage signal is illustrated with the absolute value indicating the variation of the power supply voltage.

The 4-bit power supply voltage signal d_power_range[3:0] is assigned as follows. That is, as illustrated in FIG. 13C, "0" is assigned to the variation of the power supply voltage of 0%, "1" is assigned to the absolute value of the variation of the power supply voltage in a range of greater than 0% or to less than 1%, . . . , "14" is assigned to the absolute value of the variation of the power supply voltage in a range of 13% or greater to less than 14%, and "15" is assigned to the absolute value of the variation of the power supply voltage in a range of 14% or greater.

By contrast, the 3-bit power supply voltage signal d_power_range[2:0] is assigned as follows. That is, as illustrated in FIG. 13C, "0" is assigned to the variation of the power supply voltage of 0%, "1" is assigned to the absolute value of the variation of the power supply voltage in a range of greater than 0% to less than 2%, . . . , "6" is assigned to the absolute value of the variation of the power supply voltage in a range of 10% or greater to less than 12%, and "7" is assigned to the absolute value of the variation of the power supply voltage in a range of 12% or greater.

The control register 150 converts a 4-bit power supply voltage signal d_power_range[3:0] into a 3-bit power supply voltage signal power_range[2:0] by utilizing the conversion table illustrated in FIG. 13C.

For example, in a case where the variation of the power supply voltage indicates −6.5% and the 4 power supply voltage signal d_power_range[3:0] represents "7", the 4-bit power supply voltage signal d_power_range[3:0] is converted into the 3-bit power supply voltage signal power_range [2:0] representing "4".

Next, the conversion of jitter contained in the power supply voltage is illustrated.

As illustrated in FIG. 13D, the control register 150 converts a 4-bit jitter signal d_jitter_range[3:0] into a 3-bit jitter signal jitter_range[2:0].

In this case, a voltage value of the jitter is expressed using millivolt (mV) units, and FIG. 13D illustrates a conversion table in a range from the jitter of 0 to 70 mV or greater in absolute value.

Note that since the jitter may vary in one of a plus (+) side direction and a minus (−) side direction, a ±sign is provided with numeric values representing the jitter in FIG. 13D.

Further, in order to simultaneously illustrate the variations in the plus (+) and minus (−) side directions, an absolute value is employed for representing a value of the jitter. Hence, the counterpart relationship between the 4-bit jitter and the 3-bit jitter is illustrated with the absolute value indicating the variation of the jitter.

The 4-bit jitter signal d_jitter_range[3:0] is assigned as follows. That is, as illustrated in FIG. 13D, "0" is assigned to the jitter voltage of 0 mV, "1" is assigned to the absolute value of the jitter voltage in a range of 0 mV or greater to less than 5 mV, . . . , "14" is assigned to the absolute value of the jitter voltage in a range of 65 MV or greater to less than 70 mV, and "15" is assigned to the absolute value of the jitter voltage in a range of 70 mV or greater.

By contrast, the 3-bit jitter voltage signal d_power_range [2:0] is assigned as follows. That is, "0" is assigned to the jitter voltage of 0 mV, "1" is assigned to the absolute value of the jitter voltage in a range of greater than 0 mV to less than 10 mV, . . . , "6" is assigned to the absolute value of the jitter voltage in a range of 50 mV or greater to less than 60 mV, and "7" is assigned to the absolute value of the jitter voltage in a range of 60 mV or greater.

The control register 150 converts a 4-bit jitter signal d_jitter_range[3:0] into a 3-bit jitter signal jitter_range[2:0] by utilizing the conversion table illustrated in FIG. 13D.

For example, in a case where the jitter indicates −33 mV and the 4-bit jitter signal d_jitter_range[3:0] represents "7", the 4-bit jitter signal d_jitter_range[3:0] is converted into the 3-bit jitter signal jitter_range[2:0] representing "4".

Note that in the first embodiment, the 4-bit signals output from the frequency detector 160, the temperature detector 170, the low-frequency component detector 180, and the high-frequency component detector 190 are converted into the respective 3-bit signals in the control register 150.

Thus, the signals may be input into the signal delay circuit 100 after the variations of the frequency, the temperature, and the power supply voltage are mitigated or reduced by performing the signal conversion to reduce the number of bits (converted into the less number of digits). Hence, the signals may be prevented from excessively following the variation due to the extraneous factor, and the operations of the semiconductor device including the signal delay circuit 100 may be stabilized.

Note that it is not necessary to perform the signal conversion to reduce the number of bits. Hence, the signals output from the frequency detector 160, the temperature detector 170, the low-frequency component detector 180, and the high-frequency component detector 190 may directly be input into the signal delay circuit 100.

Next, a description will be given of the acceptable range changed by the error detector 140 with reference to FIGS. 14A to 17E.

Figure 14A:
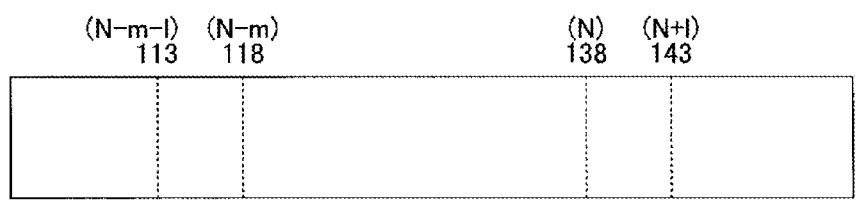
FIGS. 14A to 14C are diagrams each illustrating an acceptable range changed by an error detector 140 of the signal delay circuit 100 included in the semiconductor device of the first embodiment based on variation of a clock frequency.
Figure 14B:
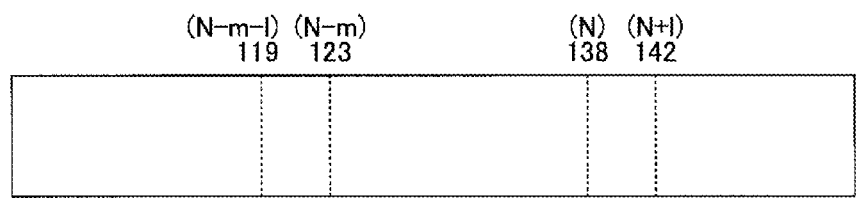
Figure 14C:
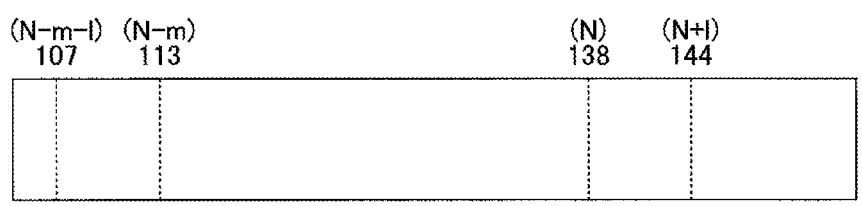

FIGS. 14A to 14C are diagrams each illustrating an acceptable range changed by an error detector 140 of the signal delay circuit 100 included in the semiconductor device of the first embodiment based on variation of a clock frequency.

The error detector 140 is configured to set a first acceptable range (N-m to N) based on codes code_N[7:0] and code_m[7:0] representing an 8-bit stable operations range input from the filter part 30. The first acceptable range corresponds to the acceptable range of the error detector 40 of the comparative example of the signal delay circuit 1.

In addition, the error detector 140 is further configured to set a second acceptable range adjoining outside the first acceptable range based on the 3-bit frequency signal frequency[2:0], the 3-bit temperature signal temperature[2:0], the 3-bit power supply voltage signal power_range[2:0], and the 4-bit jitter signal jitter_range[2:0] supplied from the control register 150. A width of the second acceptable range is determined as l.

In the signal delay circuit 100 of the first embodiment, the code code_N[7:0] represents the upper limit N of the first acceptable range, and the code code_m[7:0] represents the width m of the first acceptable range. In this case, the target value is represented by code_N[7:0]−{(code_m[7:0]/2)}. In addition, the width of the second acceptable range is l.

Note that the filter part 30 determines the upper limit N and the width m of the first acceptable range based on a distribution of the clock phase represented by the phase signal (phase) input into the filter part 30 such that the signal delay circuit 100 exhibits appropriate operating behaviors in a manner similar to that demonstrated by the comparative example of the signal delay circuit 1. Note that the filter part 30 may determine the upper limit N and the width m of the first acceptable range based on the target value.

For example, it is assumed that N is 138, and m is 20, and l is 5. In this case, the first acceptable range (N-m to N) corresponds to a range between 118 and 138. Note that the target value is 128.

In the above status, the error detector 140 sets a range between N-m-l and N-m, and a range between N and N+l as the second acceptable range. Each of the widths of the above ranges is l.

In this case, when l is 5, N-m-l is 113, N+l is 143, for example. Hence, as illustrated in FIG. 14A, the second acceptable range includes a setting range between 113 and 118 and a setting range between 138 and 143.

Hence, the acceptable range of the error detector 140 may be expanded toward the lower limit and the upper limit of the second acceptable range from the lower limit and the upper limit of the first acceptable range by setting the second acceptable range adjoining the lower side and upper side of the first acceptable range.

Note that the phase of the clock (or the phase clock) tends to vary due to the extraneous factors such as the clock frequency, the temperature of the delay part 10, and the variation ranges (jitter and wander) of the power supply voltage of the delay part 10.

Accordingly, the signal delay circuit 100 of the first embodiment not only simply expands the acceptable range of the error detector 140 but also allows the widths of the second acceptable ranges based on the extraneous factors. Hence, the signal delay circuit 100 of the first embodiment may be able to allow the clock phases to vary within an integrated acceptable range of the first acceptable range and the second acceptable range of the error detector 140.

Initially, a case where the clock frequency rises is illustrated with reference to FIG. 14B.

When the clock frequency rises, the error detector 140 reduces the width m of the first acceptable range and the width l of the second acceptable range without changing the upper limit N of the first acceptable range.

When the clock frequency rises, the error detector 140 may need to increase the sensitivity to the phase error of the error detector 140 for maintaining the high accuracy of the clock signal. Accordingly, the error detector 140 reduces the width m of the first acceptable range and the width l of the second acceptable range.

For example, when the error detector 140 has settings of the first acceptable range and the second acceptable range illustrated in FIG. 14A, it is assumed that the error detector 140 has detected the rise of the clock frequency based on the frequency signal frequency[2:0] input from the control register 150.

In this case, the error detector 140 reduces the width m of the first acceptable range while reducing the width l of the second acceptable range.

For example, when the error detector 140 reduces the width m of the first acceptable range from 20 to 15, while reducing the width l of the second acceptable range from 5 to 4, the first acceptable range is in a range between 123 and 138, and the second acceptable range is in a range between 119 and 123 and in a range between 138 and 142, as illustrated in FIG. 14B.

Next, a case where the clock frequency lowers is illustrated with reference to FIG. 14C.

When the clock frequency lowers, the error detector 140 increases the width m of the first acceptable range and the width l of the second acceptable range without changing the upper limit N of the first acceptable range.

When the clock frequency lowers, the error detector 140 may moderate or reduce the accuracy of the clock signal. Hence, the error detector 140 may be able to decrease the sensitivity to the phase error. Accordingly, the error detector 140 increases the width m of the first acceptable range and the width l of the second acceptable range.

For example, when the error detector 140 has settings of the first acceptable range and the second acceptable range illustrated in FIG. 14A, it is assumed that the error detector 140 has detected the decrease in the clock frequency based on the frequency signal frequency[2:0] input from the control register 150.

In this case, the error detector 140 increases the width m of the first acceptable range while increasing the width l of the second acceptable range.

For example, the error detector 140 increases the width m of the first acceptable range from 20 to 25, while increasing the width l of the second acceptable range from 5 to 6, the first acceptable range is in a range between 113 and 138, and the second acceptable range is in a range between 107 and 113 and in a range between 138 and 144, as illustrated in FIG. 14C.

As described above, the error detector 140 varies the acceptable range(s) based on the change in the clock frequency.

Note that in the first embodiment, the upper limit N of the first acceptable range is not affected by the variation of the clock frequency. However, the upper limit N of the first acceptable range may be varied with the variation of the width m of the first acceptable range for maintaining the target value identical to the target value prior to the change in the clock frequency.

That is, the upper limit N of the first acceptable range and the width m of the first acceptable range may both be reduced such that the target value represented by N-m/2 is identical to the target value prior to the rise of the clock frequency.

Further, the upper limit N of the first acceptable range and the width m of the first acceptable range may simultaneously be increased such that the target value represented by N-m/2 is identical to the target value prior to the decrease in the clock frequency.

In addition, the second acceptable range may be set in one of the lower side and the upper side of the first acceptable range alone.

Next, a description will be given, with reference to FIGS. 15A to 15C, of the acceptable ranges being changed based on the variation of the temperature of the delay part 10.

Figure 15A:
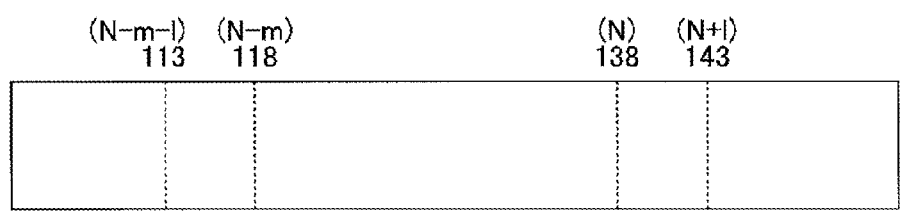
FIGS. 15A to 15C are diagrams each illustrating an acceptable range changed by the error detector 140 of the signal delay circuit 100 included in the semiconductor device of the first embodiment based on variation of the temperature of the delay part 10.
Figure 15B:
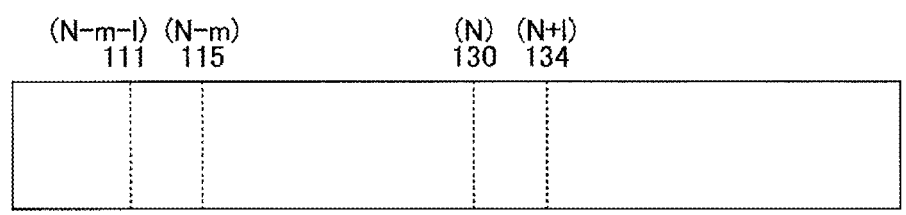
Figure 15C:
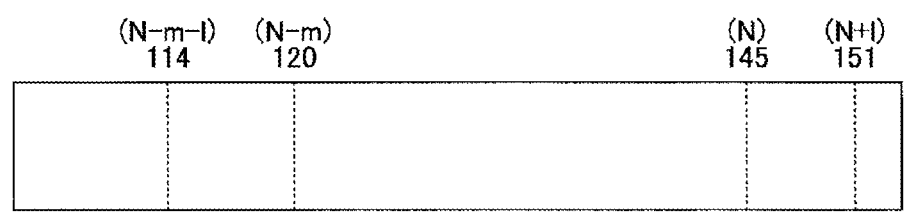

FIGS. 15A to 15C are diagrams each illustrating an acceptable range changed by an error detector 140 of the signal delay circuit 100 included in the semiconductor device of the first embodiment based on variation of the temperature of the delay part 10.

For example, it is assumed that N is 138, and m is 20, and l is 5 in a manner similar to the case where the clock frequency is varied. In this case, the first acceptable range (N-m to N) corresponds to a range between 118 and 138, as illustrated in FIG. 15A. Note that the target value is 128.

Since the inverters and selectors included in the delay part 10 include complementary metal oxide semiconductors (CMOS), the temperature rise of the delay part 10 may degrade the operations speed of the CMOS while increasing the amount of delay in the delay part 10. On the other hand, the temperature decrease may increase the operations speed of the CMOS, and hence, the amount of delay in the delay part 10 will be decreased.

Since the temperature increase results in an increase in the amount of delay in one stage included in the delay part 10, the number of stages necessary for acquiring a predetermined amount of delay may be decreased. Thus, the error detector 140 reduces the upper limit N of the first acceptable range when the temperature of the delay part 10 rises.

Similarly, the error detector 140 reduces the width m of the first acceptable range when the temperature of the delay part 10 rises.

For example, when the error detector 140 has settings of the first acceptable range and the second acceptable range illustrated in FIG. 15A, it is assumed that the error detector 140 has detected the rise of the temperature of the delay part 10 based on the temperature signal temperature[2:0] input from the control register 150.

In this case, the error detector 140 reduces the upper limit N of the first acceptable range, the width m of the first acceptable range, and the width l of the second acceptable range.

For example, when the error detector 140 reduces the upper limit N of the first acceptable range from 138 to 130, the width m of the first acceptable range from 20 to 15, and the width l of the second acceptable range from 5 to 4, the first acceptable range is in a range between 115 and 130, and the second acceptable range is in a range between 111 and 115 and in a range between 130 and 134, as illustrated in FIG. 15B.

On the other hand, since the temperature decrease results in a decrease in the amount of delay in one stage included in the delay part 10, the number of stages necessary for acquiring the predetermined amount of delay may be increased. Thus, the error detector 140 increases the upper limit N of the first acceptable range when the temperature of the delay part 10 decreases.

Similarly, the error detector 140 increases the width m of the first acceptable range and the width l of the second acceptable range when the temperature of the delay part 10 decreases.

For example, when the error detector 140 has settings of the first acceptable range and the second acceptable range illustrated in FIG. 15A, it is assumed that the error detector 140 has detected the decrease in the temperature of the delay part 10 based on the temperature signal temperature[2:0] input from the control register 150.

In this case, the error detector 140 increases the upper limit N of the first acceptable range, the width m of the first acceptable range, and the width l of the second acceptable range.

For example, when the error detector 140 increases the upper limit N of the first acceptable range from 138 to 145, the width m of the first acceptable range from 20 to 25, and the width l of the second acceptable range from 5 to 6, the first acceptable range is in a range between 120 and 145, and the second acceptable range is in a range between 114 and 120 and in a range between 145 and 151, as illustrated in FIG. 15C.

As described above, the error detector 140 varies the acceptable ranges based on the change in the temperature of the delay part 10.

Note that the second acceptable range may be set in one of the lower side and the upper side of the first acceptable range alone.

Next, a description will be given, with reference to FIGS. 16A to 16E, of the acceptable ranges being changed based on variation of a power supply voltage of the delay part 10.

FIGS. 16A to 16E are diagrams each illustrating an acceptable range being changed by the error detector 140 of the signal delay circuit 100 included in the semiconductor device of the first embodiment based on the variation of the voltage range of the power supply voltage.

Figure 16A:
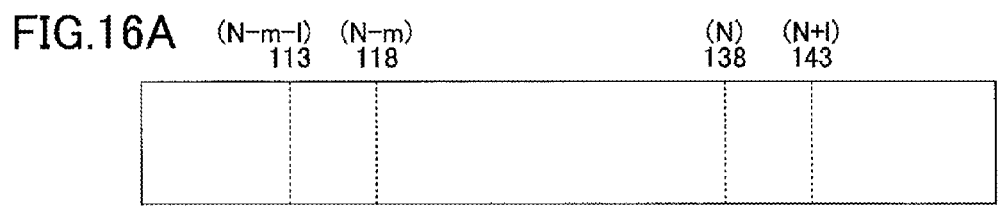
FIGS. 16A to 16E are diagrams each illustrating an acceptable range changed based on variation of a voltage range of a power supply voltage by an error detector 140 of the signal delay circuit 100 included in the semiconductor device of the first embodiment.

For example, it is assumed that N is 138, and m is 20, and l is 5 in a manner similar to the case where the clock frequency is varied. In this case, the first acceptable range (N-m to N) corresponds to a range between 118 and 138, as illustrated in FIG. 16A. Note that the target value is 128.

When the power supply voltage of the delay part 10 varies in a plus (+) side direction, the operations speed of the CMOS included in the delay part 10 is increased. Thus, delay per unit time for each of the stages may be reduced.

On the other hand, when the power supply voltage of the delay part 10 varies in a minus (−) side direction, the operations speed of the CMOS included in the delay part 10 is decreased. Thus, delay per unit time for each of the stages may be increased.

The power supply voltage may, for example, swing over either toward the plus (+) side or toward the minus (−) side due to wander.

Hence, the error detector 140 increases the upper limit N of the first acceptable range and the width m of the first acceptable range when the power supply voltage of the delay part 10 varies in a plus (+) side direction.

On the other hand, the error detector 140 decreases the upper limit N of the first acceptable range and the width m of the first acceptable range when the power supply voltage of the delay part 10 varies in a minus (−) side direction.

Further, when the absolute value of the variation degrees of the power supply voltage in the delay part 10 tends to increase, the absolute value of the variation amount of the delay time in the delay part 10 per unit time tends to increase.

Specifically, when the variation degrees of the power supply voltage in the delay part 10 tends to increase in the plus (+) side direction, the reduced variation amount of the delay time in the delay part 10 per unit time tends to increase. By contrast, when the variation degrees of the power supply voltage in the delay part 10 tends to increase in the minus (−) side direction, the increased variation amount of the delay time in the delay part 10 per unit time tends to increase.

Further, when the absolute value of the variation degrees of the power supply voltage in the delay part 10 tends to decrease, the absolute value of the variation amount of the delay time in the delay part 10 per unit time tends to decrease.

Specifically, when the variation degrees of the power supply voltage in the delay part 10 tends to decrease in the plus (+) side direction, the reduced variation amount of the delay time in the delay part 10 per unit time tends to decrease. By contrast, when the variation degrees of the power supply voltage in the delay part 10 tends to decrease in the minus (−) side direction, the increased variation amount of the delay time in the delay part 10 per unit time tends to decrease.

Hence, the error detector 140 increases the width l of the second acceptable range when the absolute value of the variation degrees of the power supply voltage in the delay part 10 tends to increase.

By contrast, the error detector 140 decreases the width l of the second acceptable range when the absolute value of the variation degrees of the power supply voltage in the delay part 10 tends to decrease.

The error detector 140 increases the upper limit N of the first acceptable range, the width m of the first acceptable range and the width l of the second acceptable range when the power supply voltage of the delay part 10 varies in the plus (+) side direction and the variation degrees of the power supply voltage in the delay part 10 tends to increase.

For example, when the error detector 140 has settings of the first acceptable range and the second acceptable range illustrated in FIG. 16A, it is assumed that the error detector 140 has detected that the power supply voltage of the delay part 10 varies in the plus (+) side direction and the variation degrees of the power supply voltage in the delay part 10 tends to increase, based on the power supply voltage signal power_range[2:0] input from the control register 150.

In this case, the error detector 140 increases the upper limit N of the first acceptable range, the width m of the first acceptable range, and the width l of the second acceptable range.

Figure 16B:
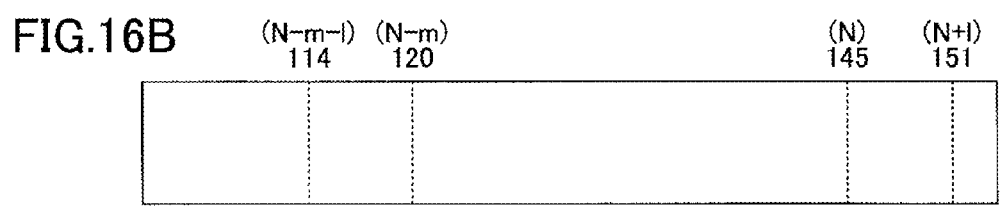

For example, it is assumed that the error detector 140 increases the upper limit N of the first acceptable range from 138 to 145, the width m of the first acceptable range from 20 to 25, and the width l of the second acceptable range from 5 to 6. In this case, the first acceptable range corresponds to a range between 120 and 145, and a range between 145 and 151, as illustrated in FIG. 16B.

The error detector 140 decreases the upper limit N of the first acceptable range and the width m of the first acceptable range while increasing the width l of the second acceptable range when the power supply voltage of the delay part 10 varies in the minus (−) side direction and the variation degrees of the power supply voltage in the delay part 10 tends to increase.

For example, when the error detector 140 has settings of the first acceptable range and the second acceptable range illustrated in FIG. 16A, it is assumed that the error detector 140 has detected that the power supply voltage of the delay part 10 varies in the minus (−) side direction and the variation degrees of the power supply voltage in the delay part 10 tends to increase, based on the power supply voltage signal power_range[2:0] input from the control register 150.

In this case, the error detector 140 decreases the upper limit N of the first acceptable range and the width m of the first acceptable range while increasing the width l of the second acceptable range.

Figure 16C:
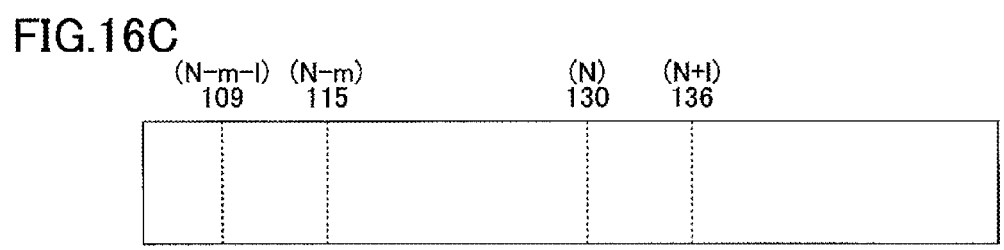

For example, it is assumed that the error detector 140 decreases the upper limit N of the first acceptable range from 138 to 130 and the width m of the first acceptable range from 20 to 15 while increasing the width l of the second acceptable range from 5 to 6. In this case, the first acceptable range corresponds to a range between 115 and 130, and the second acceptable range corresponds to a range between 109 and 115 and a range between 130 and 136, as illustrated in FIG. 16C.

The error detector 140 increases the upper limit N of the first acceptable range and the width m of the first acceptable range while decreasing the width l of the second acceptable range when the power supply voltage of the delay part 10 varies in the plus (+) side direction and the variation degrees of the power supply voltage in the delay part 10 tends to decrease.

For example, when the error detector 140 has settings of the first acceptable range and the second acceptable range illustrated in FIG. 16A, it is assumed that the error detector 140 has detected that the power supply voltage of the delay part 10 varies in the plus (+) side direction and the variation degrees of the power supply voltage in the delay part 10 tends to decrease, based on the power supply voltage signal power_range[2:0] input from the control register 150.

In this case, the error detector 140 increases the upper limit N of the first acceptable range and the width m of the first acceptable range while decreasing the width l of the second acceptable range.

Figure 16D:
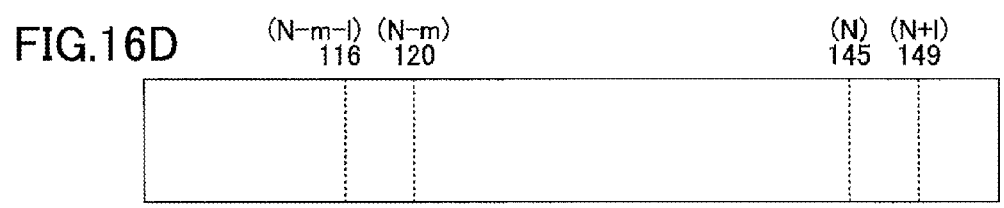

For example, it is assumed that the error detector 140 increases the upper limit N of the first acceptable range from 138 to 145 and the width m of the first acceptable range from 20 to 25 while decreasing the width l of the second acceptable range from 5 to 4. In this case, the first acceptable range corresponds to a range between 120 and 145, and the second acceptable range corresponds to a range between 116 and 120 and a range between 145 and 149, as illustrated in FIG. 16D.

The error detector 140 decreases the upper limit N of the first acceptable range, the width m of the first acceptable range, and the width l of the second acceptable range when the power supply voltage of the delay part 10 varies in the minus (−) side direction and the variation degrees of the power supply voltage in the delay part 10 tends to decrease.

For example, when the error detector 140 has settings of the first acceptable range and the second acceptable range illustrated in FIG. 16A, it is assumed that the error detector 140 has detected that the power supply voltage of the delay part 10 varies in the minus (−) side direction and the variation degrees of the power supply voltage in the delay part 10 tends to decrease, based on the power supply voltage signal power_range[2:0] input from the control register 150.

In this case, the error detector 140 reduces the upper limit N of the first acceptable range, the width m of the first acceptable range, and the width l of the second acceptable range.

Figure 16E:
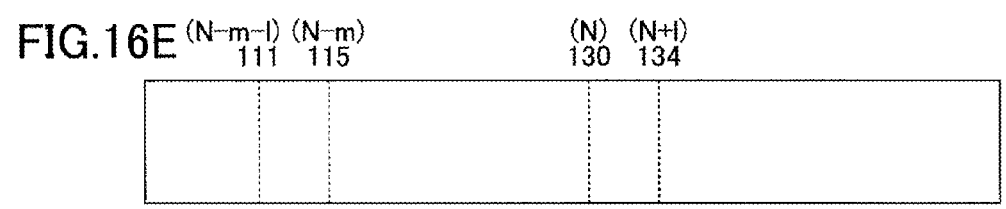

For example, it is assumed that the error detector 140 decreases the upper limit N of the first acceptable range from 138 to 130, the width m of the first acceptable range from 20 to 15, and the width l of the second acceptable range from 5 to 4. In this case, the first acceptable range corresponds to a range between 115 and 130, and the second acceptable range corresponds to a range between 111 and 115 and a range between 130 and 134, as illustrated in FIG. 16E.

As described above, the error detector 140 varies the acceptable ranges based on the change in the power supply voltage of the delay part 10.

Note that the second acceptable range may be set in one of the lower side and the upper side of the first acceptable range alone.

Next, a description will be given, with reference to FIGS. 17A to 17E, of the acceptable ranges being changed based on a jitter variation of the power supply voltage of the delay part 10.

The change in the acceptable ranges when the jitter variation of the power supply voltage of the delay part 10 is observed is basically the same as the change in the acceptable ranges when the variation of the power supply voltage of the delay part 10 is observed.

FIGS. 17A to 17E are diagrams each illustrating an acceptable range being changed by the error detector 140 of the signal delay circuit 100 included in the semiconductor device of the first embodiment based on the jitter variation of the voltage range of the power supply voltage.

Figure 17A:
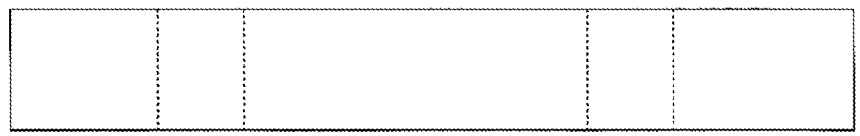
FIGS. 17A to 17E are diagrams each illustrating an acceptable range changed based on variation of jitter of the power supply voltage by an error detector 140 of the signal delay circuit 100 included in the semiconductor device of the first embodiment.

For example, it is assumed that N is 138, and m is 20, and l is 5 in a manner similar to the case where the clock frequency is varied. In this case, the first acceptable range (N-m to N) is a range between 118 and 138, as illustrated in FIG. 17A. Note that the target value is 128.

When the power supply voltage of the delay part 10 is varied in a plus (+) side direction, the operations speed of the CMOS included in the delay part 10 is increased. Thus, delay per unit time for each of the stages may be reduced.

On the other hand, when the power supply voltage of the delay part 10 varies in a minus (−) side direction, the operations speed of the CMOS included in the delay part 10 is decreased. Thus, delay per unit time for each of the stages may be increased.

The power supply voltage may, for example, swing over either toward the plus (+) side or toward the minus (−) side due to jitter.

Hence, the error detector 140 increases the upper limit N of the first acceptable range and the width m of the first acceptable range when the power supply voltage of the delay part 10 varies in a plus (+) side direction.

On the other hand, the error detector 140 decreases the upper limit N of the first acceptable range and the width m of the first acceptable range when the power supply voltage of the delay part 10 varies in a minus (−) side direction.

Further, when the absolute value of the variation degrees of the power supply voltage in the delay part 10 tends to increase, the absolute value of the variation amount of the delay time in the delay part 10 per unit time tends to increase.

Specifically, when the variation degrees of the power supply voltage in the delay part 10 tends to increase in the plus (+) side direction, the reduced variation amount of the delay time in the delay part 10 per unit time tends to increase. By contrast, when the variation degrees of the power supply voltage in the delay part 10 tends to increase in the minus (−) side direction, the increased variation amount of the delay time in the delay part 10 per unit time tends to increase.

Further, when the absolute value of the variation degrees of the power supply voltage in the delay part 10 tends to decrease, the absolute value of the variation amount of the delay time in the delay part 10 per unit time tends to decrease.

Specifically, when the variation degrees of the power supply voltage in the delay part 10 tends to decrease in the plus (+) side direction, the reduced variation amount of the delay time in the delay part 10 per unit time tends to decrease. By contrast, when the variation degrees of the power supply voltage in the delay part 10 tends to decrease in the minus (−) side direction, the increased variation amount of the delay time in the delay part 10 per unit time tends to decrease.

Hence, the error detector 140 increases the width l of the second acceptable range when the absolute value of the variation degrees of the power supply voltage in the delay part 10 tends to increase.

By contrast, the error detector 140 decreases the width l of the second acceptable range when the absolute value of the variation degrees of the power supply voltage in the delay part 10 tends to decrease.

The error detector 140 increases the upper limit N of the first acceptable range, the width m of the first acceptable range and the width l of the second acceptable range when the power supply voltage of the delay part 10 varies in the plus (+) side direction and the variation degrees of the power supply voltage in the delay part 10 tends to increase.

For example, when the error detector 140 has settings of the first acceptable range and the second acceptable range illustrated in FIG. 17A, it is assumed that the error detector 140 has detected that the power supply voltage of the delay part 10 varies in the plus (+) side direction and the variation degrees of the power supply voltage in the delay part 10 tends to increase, based on the jitter signal jitter_range[2:0] input from the control register 150.

In this case, the error detector 140 increases the upper limit N of the first acceptable range, the width m of the first acceptable range, and the width l of the second acceptable range.

Figure 17B:
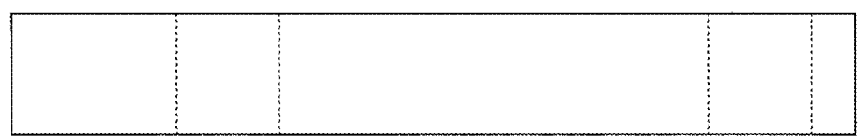

For example, it is assumed that the error detector 140 increases the upper limit N of the first acceptable range from 138 to 145, the width m of the first acceptable range from 20 to 25, and the width l of the second acceptable range from 5 to 6. In this case, the first acceptable range corresponds to a range between 120 and 145, and the second acceptable range corresponds to a range between 114 and 120 and a range between 145 and 151, as illustrated in FIG. 17B.

The error detector 140 decreases the upper limit N of the first acceptable range and the width m of the first acceptable range while increasing the width l of the second acceptable range when the power supply voltage of the delay part 10 varies in the minus (−) side direction and the variation degrees of the power supply voltage in the delay part 10 tends to increase.

For example, when the error detector 140 has settings of the first acceptable range and the second acceptable range illustrated in FIG. 17A, it is assumed that the error detector 140 has detected that the power supply voltage of the delay part 10 varies in the minus (−) side direction and the variation degrees of the power supply voltage in the delay part 10 tends to increase, based on the jitter signal jitter_range[2:0] input from the control register 150.

In this case, the error detector 140 decreases the upper limit N of the first acceptable range and the width m of the first acceptable range while increasing the width l of the second acceptable range.

Figure 17C:
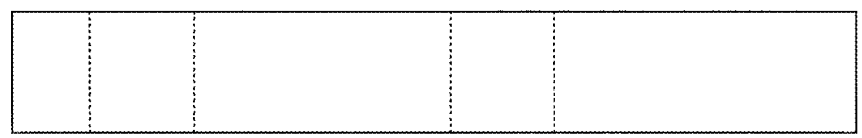

For example, it is assumed that the error detector 140 decreases the upper limit N of the first acceptable range from 138 to 130 and the width m of the first acceptable range from 20 to 15 while increasing the width l of the second acceptable range from 5 to 6. In this case, the first acceptable range corresponds to a range between 115 and 130, and the second acceptable range corresponds to a range between 109 and 115 and a range between 130 and 136, as illustrated in FIG. 17C.

The error detector 140 increases the upper limit N of the first acceptable range and the width m of the first acceptable range while decreasing the width l of the second acceptable range when the power supply voltage of the delay part 10 varies in the plus (+) side direction and the variation degrees of the power supply voltage in the delay part 10 tends to decrease.

For example, when the error detector 140 has settings of the first acceptable range and the second acceptable range illustrated in FIG. 17A, it is assumed that the error detector 140 has detected that the power supply voltage of the delay part 10 varies in the plus (+) side direction and the variation degrees of the power supply voltage in the delay part 10 tends to decrease, based on the jitter signal jitter_range[2:0] input from the control register 150.

In this case, the error detector 140 increases the upper limit N of the first acceptable range and the width m of the first acceptable range while decreasing the width l of the second acceptable range.

Figure 17D:

For example, it is assumed that the error detector 140 increases the upper limit N of the first acceptable range from 138 to 145 and the width m of the first acceptable range from 20 to 25 while decreasing the width l of the second acceptable range from 5 to 4. In this case, the first acceptable range corresponds to a range between 120 and 145, and the second acceptable range corresponds to a range between 116 and 120 and a range between 145 and 149, as illustrated in FIG. 17D.

The error detector 140 decreases the upper limit N of the first acceptable range, the width m of the first acceptable range, and the width l of the second acceptable range when the power supply voltage of the delay part 10 varies in the minus (−) side direction and the variation degrees of the power supply voltage in the delay part 10 tends to decrease.

For example, when the error detector 140 has settings of the first acceptable range and the second acceptable range illustrated in FIG. 17A, it is assumed that the error detector 140 has detected that the power supply voltage of the delay part 10 varies in the minus (−) side direction and the variation degrees of the power supply voltage in the delay part 10 tends to decrease, based on the jitter signal jitter_range[2:0] input from the control register 150.

In this case, the error detector 140 reduces the upper limit N of the first acceptable range, the width m of the first acceptable range, and the width l of the second acceptable range.

Figure 17E:
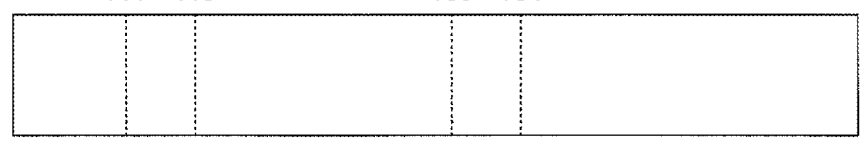

For example, it is assumed that the error detector 140 decreases the upper limit N of the first acceptable range from 138 to 130, the width m of the first acceptable range from 20 to 15, and the width l of the second acceptable range from 5 to 4. In this case, the first acceptable range corresponds to a range between 115 and 130, and the second acceptable range corresponds to a range between 111 and 115 and a range between 130 and 134, as illustrated in FIG. 17E.

As described above, the error detector 140 varies the acceptable ranges based on the change in the jitter power supply voltage of the delay part 10.

Note that the second acceptable range may be set in one of the lower side and the upper side of the first acceptable range alone.

As described above, according to the signal delay circuit 100 included in the semiconductor device of the first embodiment, when the clock frequency varies based on the extraneous factors, the acceptable ranges of the error detector 140 may be varied based on the extraneous factors.

Accordingly, erroneous detection may be suppressed, and the entire semiconductor device including the signal delay circuit 100 of the first embodiment may be able to secure stable operations without interruption.

Specifically, the acceptable ranges of the error detector 140 may be varied based on the variation of the clock frequency, the variation of the temperature of the delay part 100, and the variation ranges (jitter and wander) of the power supply voltage of the signal delay circuit 100.

Hence, stable operations of the signal delay circuit 100 or the semiconductor device including the signal delay circuit 100 may be secured without interruption in accordance with the types and variation tendencies by optimally setting the acceptable ranges based on the extraneous factors while securing the responsiveness of the signal delay circuit 100.

Second Embodiment

Figure 18:
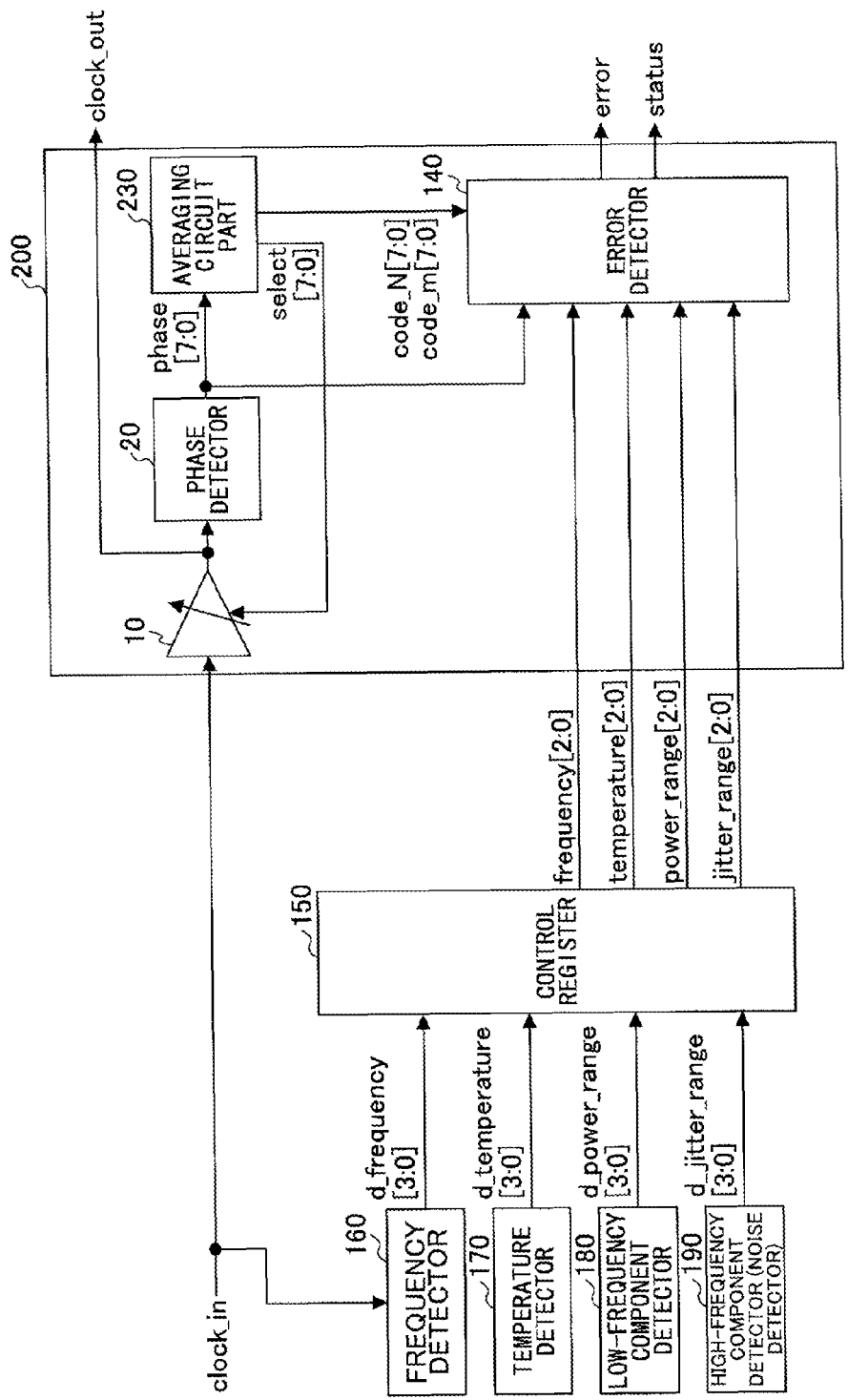
FIG. 18 is a diagram illustrating a signal delay circuit 200 included in a semiconductor device of a second embodiment.

FIG. 18 is a diagram illustrating a signal delay circuit 200 included in a semiconductor device of a second embodiment.

The signal delay circuit 200 of the second embodiment differs from the signal delay circuit 100 of the first embodiment in that the filter part 30 of the signal delay circuit 100 is replaced with an averaging circuit part 230.

The elements of the signal delay circuit 200 of the second embodiment other than the averaging circuit part 230 that are the same as or equivalent to those of the signal delay circuit 100 of the first embodiment are designated by the same reference numerals, and a description thereof will be omitted.

The averaging circuit part 230 is configured to maintain the target value of the clock phase output from the delay part 10 and perform an averaging process to cause the clock phase output from the delay part 10 to fall within a predetermined range. The predetermined range corresponds to the stable operations range held by the filter part 30 of the signal delay circuit 100 of the first embodiment.

The predetermined range set by the averaging circuit part 230 is a range having a predetermined width setting the target value of the clock phase output from the delay part 10 as an approximately middle value.

The averaging circuit part 230 outputs, when performing the averaging process, the mean of the clock phase represented by the phase signal (phase) input by the phase detector 20 for every clock period.

The averaging circuit part 230 further returns a selection signal (select) for adjusting the amount of delay in the delay part 10 based on the difference between the input clock phase and the target value. In addition, the averaging circuit part 230 outputs a code representing the predetermined range into the error detector 40. The upper limit of the predetermined range for the averaging process used by the averaging circuit part 230 is represented by code_N[7:0], and the width of the predetermined range is represented by code_m[7:0].

The error detector 140 changes the acceptable ranges based on the extraneous factors of the input clock based on the upper limit code_N[7:0] and the width code_m[7:0] of the predetermined range in a similar manner as that of the error detector 140 of the signal delay circuit 100 of the first embodiment.

Hence, the signal delay circuit 200 of the second embodiment varies the acceptable ranges of the error detector 140 based on variations of the extraneous factors when the clock phase is varied due to the extraneous factors.

Hence, the erroneous detection may be suppressed, which may allow the entire semiconductor device including the signal delay circuit 200 of the second embodiment to operate stably without interruption.

Specifically, the signal delay circuit 200 of the second embodiment varies the acceptable ranges of the error detector 140 based on a variation of the clock frequency, a variation in the temperature of the signal delay circuit 200, and a variation of the power supply voltage (i.e., variation in wander or jitter).

Accordingly, the semiconductor device including the signal delay circuit 200 or the signal delay circuit 100 may be able to exhibit stable operating behaviors based on the types and tendencies of the extraneous factors by setting the acceptable ranges based on the extraneous factors while securing the responsiveness of the signal delay circuit 200.

The aforementioned first and second embodiments may be able to provide the semiconductor device capable of exhibiting excellent responsiveness with a simpler configuration and securing stable operations and the information processing apparatus having such a semiconductor device.

Although the embodiments are denoted as, for example, "first," or "second", these numbers do not specify priorities of the embodiments. Numerous other variations and modifications will be made, which is apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a delay part configured to delay an external input signal;
   a phase detector configured to detect a phase of an output signal output from the delay part;
   a setting part configured to set a stable operations range of the phase of the output signal based on phase information output from the phase detector; and
   an error detector configured to set an acceptable range corresponding to the stable operations range, determine whether the phase of the output signal falls within the acceptable range, and change the acceptable range based on an extraneous factor of the external input signal of the delay part,
   wherein the setting part adjusts an amount of delay of the delay part based on a difference between a target value and the phase of the output signal within the stable operations range.

2. The semiconductor device as claimed in claim 1, further comprising:
   a frequency detector configured to detect a frequency of the external input signal as the extraneous factor,
   wherein the error detector sets a first acceptable range, and a second acceptable range extending from one of a higher phase side and a lower phase side of the first acceptable range as the acceptable range, and decreases a width of the first acceptable range and a width of the second acceptable range when a frequency of the external input signal detected by the frequency detector rises.

3. The semiconductor device as claimed in claim 1, further comprising:
   a frequency detector configured to detect a frequency of the external input signal as the extraneous factor,
   wherein the error detector sets a first acceptable range, and a second acceptable range extending from one of a higher phase side and a lower phase side of the first acceptable range as the acceptable range, and increases a width of the first acceptable range and a width of the second acceptable range when a frequency of the external input signal detected by the frequency detector lowers.

4. The semiconductor device as claimed in claim 1, further comprising:
   a temperature detector configured to detect a temperature of the semiconductor device as the extraneous factor,
   wherein the error detector sets a first acceptable range, and a second acceptable range extending from one of a higher phase side and a lower phase side of the first acceptable range as the acceptable range, and decreases an upper limit of the first acceptable range, a width of the first acceptable range, and a width of the second acceptable range when the temperature of the semiconductor device detected by the temperature detector rises.

5. The semiconductor device as claimed in claim 1, further comprising:
   a temperature detector configured to detect a temperature of the semiconductor device as the extraneous factor,
   wherein the error detector sets a first acceptable range, and a second acceptable range extending from one of a higher phase side and a lower phase side of the first acceptable range as the acceptable range, and increases an upper limit of the first acceptable range, a width of the first acceptable range, and a width of the second acceptable range when the temperature of the semiconductor device detected by the temperature detector lowers.

6. The semiconductor device as claimed in claim 1, further comprising:
   a power supply voltage detector configured to detect a variation of a power supply voltage of the semiconductor device as the extraneous factor,
   wherein the error detector sets a first acceptable range, and a second acceptable range extending from one of a higher phase side and a lower phase side of the first acceptable range as the acceptable range, and increases an upper limit of the first acceptable range, a width of the first acceptable range, and a width of the second acceptable range when the variation of the power supply voltage of the semiconductor device detected by the power supply voltage detector tends to increase in a direction toward a positive side.

7. The semiconductor device as claimed in claim 1, further comprising:
   a power supply voltage detector configured to detect a variation of a power supply voltage of the semiconductor device as the extraneous factor,
   wherein the error detector sets a first acceptable range, and a second acceptable range extending from one of a higher phase side and a lower phase side of the first acceptable range as the acceptable range, and decreases an upper limit of the first acceptable range and a width of the first acceptable range while increasing a width of the second acceptable range when the variation of the power supply voltage of the semiconductor device detected by the power supply voltage detector tends to increase in a direction toward a negative side.

8. The semiconductor device as claimed in claim 1, further comprising:
   a power supply voltage detector configured to detect a variation of a power supply voltage of the semiconductor device as the extraneous factor,
   wherein the error detector sets a first acceptable range, and a second acceptable range extending from one of a higher phase side and a lower phase side of the first acceptable range as the acceptable range, and increases an upper limit of the first acceptable range and a width of the first acceptable range while decreasing a width of the second acceptable range when the variation of the power supply voltage of the semiconductor device detected by the power supply voltage detector tends to decrease in a direction toward a positive side.

9. The semiconductor device as claimed in claim 1, further comprising:
- a power supply voltage detector configured to detect a variation of a power supply voltage of the semiconductor device as the extraneous factor,
- wherein the error detector sets a first acceptable range, and a second acceptable range extending from one of a higher phase side and a lower phase side of the first acceptable range as the acceptable range, and decreases an upper limit of the first acceptable range, a width of the first acceptable range, and a width of the second acceptable range when the variation of the power supply voltage of the semiconductor device detected by the power supply voltage detector tends to decrease in a direction toward a negative side.

10. An information processing apparatus, comprising:
an arithmetic processing unit;
a main storage unit; and
a semiconductor device as claimed in claim 1.

11. The information processing apparatus as claimed in claim 10, further comprising:
- a memory controller configured to transfer data between the arithmetic processing unit and the main storage unit.

12. The information processing apparatus as claimed in claim 10, wherein the semiconductor device includes a memory controller configured to transfer data between the arithmetic processing unit and the main storage unit.

* * * * *